United States Patent
Yahata et al.

(10) Patent No.: US 8,124,999 B2
(45) Date of Patent: Feb. 28, 2012

(54) LIGHT EMITTING ELEMENT AND METHOD OF MAKING THE SAME

(75) Inventors: Kosuke Yahata, Aichi-ken (JP); Naoki Nakajo, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 250 days.

(21) Appl. No.: 12/458,362

(22) Filed: Jul. 9, 2009

(65) Prior Publication Data
US 2010/0012968 A1    Jan. 21, 2010

(30) Foreign Application Priority Data

Jul. 18, 2008 (JP) .................................. 2008-186776
Jul. 22, 2008 (JP) .................................. 2008-188855

(51) Int. Cl.
*H01L 33/38* (2010.01)
(52) U.S. Cl. ................... 257/99; 257/745; 257/E33.065; 257/E33.062
(58) Field of Classification Search ..................... 257/79, 257/99, 81, 91, 745, E33.062, E33.065
See application file for complete search history.

(56) References Cited

U.S. PATENT DOCUMENTS

| | | | |
|---|---|---|---|
| 6,486,499 B1 | 11/2002 | Krames et al. | |
| 6,514,782 B1 * | 2/2003 | Wierer et al. | 438/22 |
| 2002/0171087 A1 | 11/2002 | Krames et al. | |
| 2005/0194605 A1 * | 9/2005 | Shelton et al. | 257/99 |
| 2007/0246735 A1 | 10/2007 | Yahata et al. | |

FOREIGN PATENT DOCUMENTS

| | | |
|---|---|---|
| JP | 11-191641 | 7/1999 |
| JP | 2001-203386 | 7/2001 |
| JP | 2004-153110 | 5/2004 |
| JP | 2004-266296 | 9/2004 |
| JP | 2007-300063 | 11/2007 |
| JP | 2008282930 A * | 11/2008 |

OTHER PUBLICATIONS

English Machine Translation of JP2008282930A.*

* cited by examiner

*Primary Examiner* — Jerome Jackson, Jr.
*Assistant Examiner* — Yu Chen
(74) *Attorney, Agent, or Firm* — McGinn IP Law Group, PLLC

(57) ABSTRACT

A light emitting element includes a first electrode, a second electrode formed on a same side as the first electrode and including an area less than the first electrode, a first bump formed on the first electrode, and a second bump formed on the second electrode and including a level at a top thereof higher than that of the first bump. A flip-chip type light emitting element includes a spreading electrode, the spreading electrode including an extended part, and plural intermediate electrodes formed on the spreading electrode and arranged in a longitudinal direction of the extended part and centrally in a width direction of the extended part. The intermediate electrodes are disposed such that a distance of half a pitch thereof in the longitudinal direction is equal to or shorter than a distance from one of the intermediate electrodes to an edge of the extended part.

16 Claims, 17 Drawing Sheets

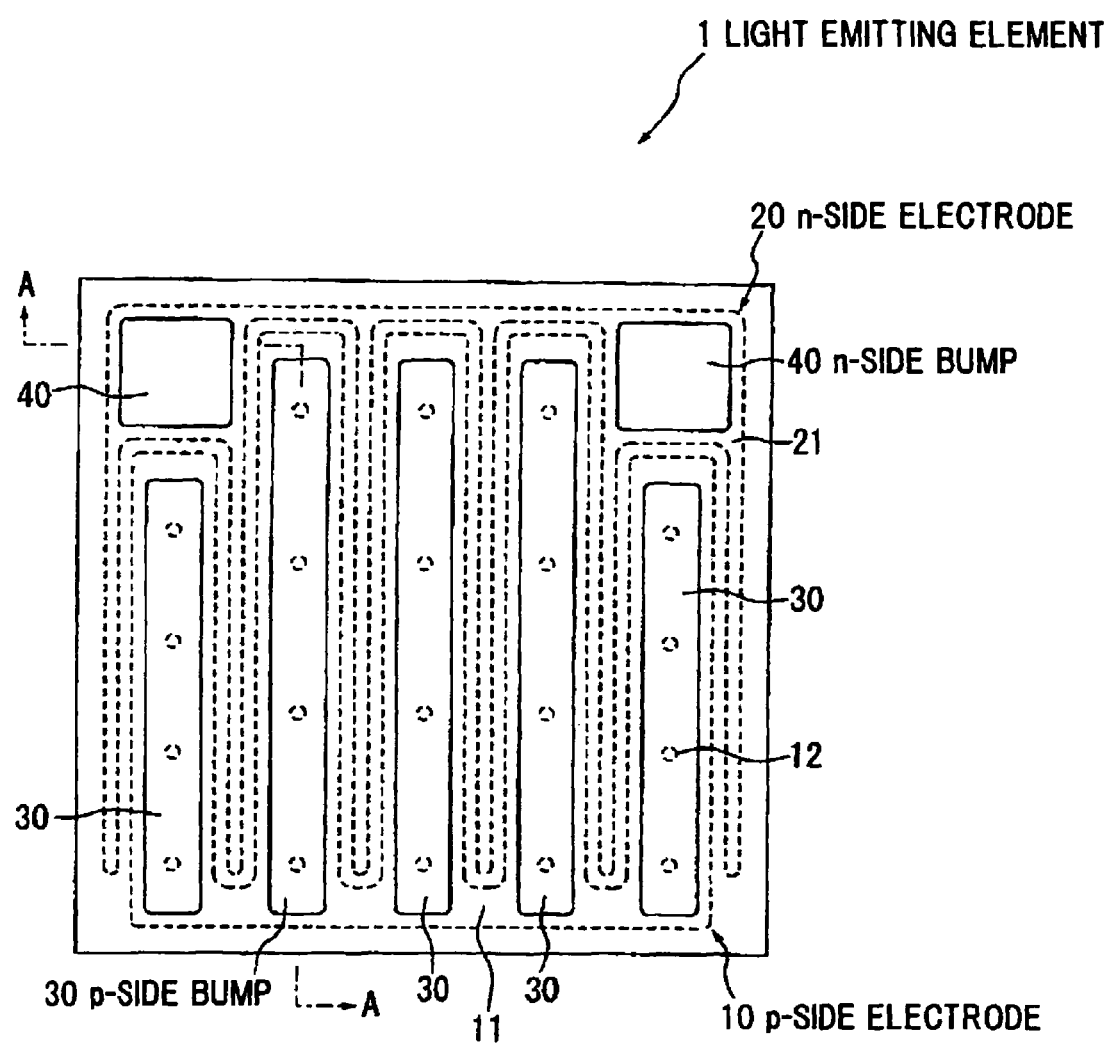

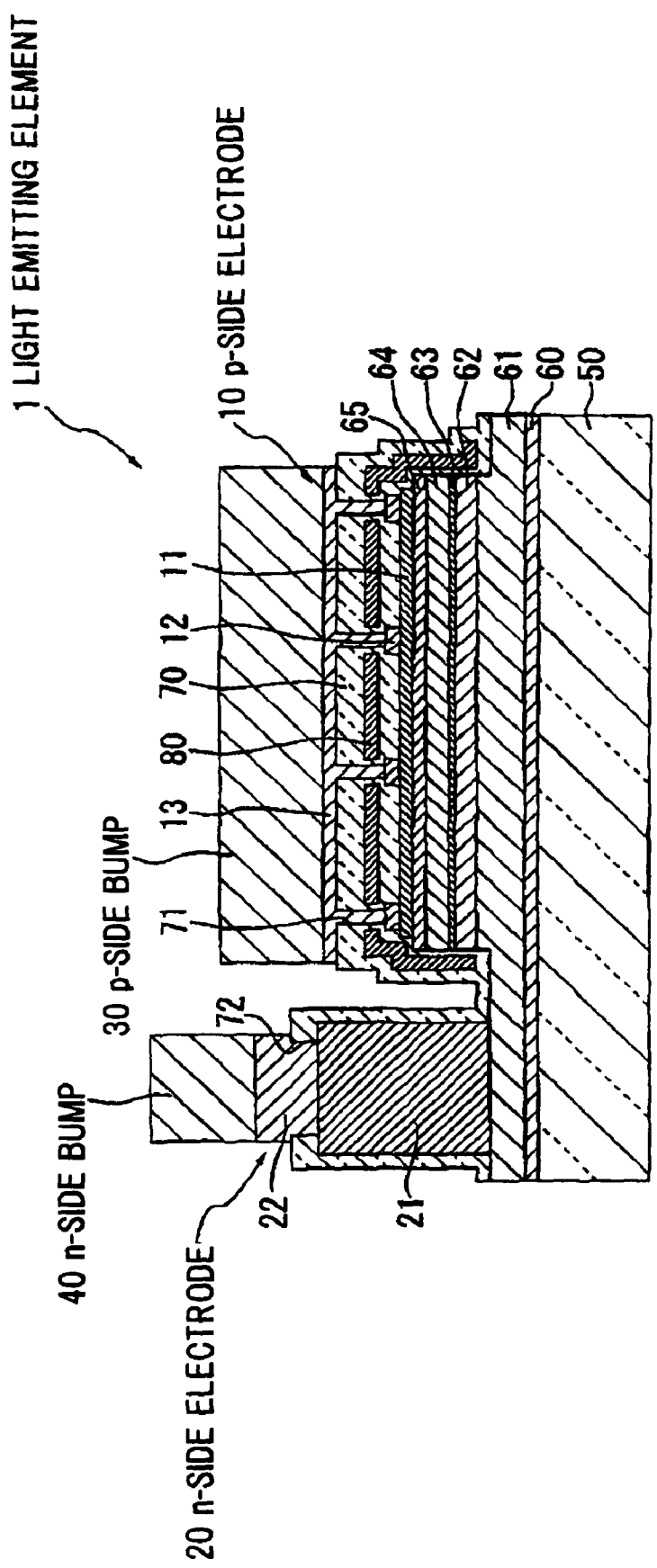

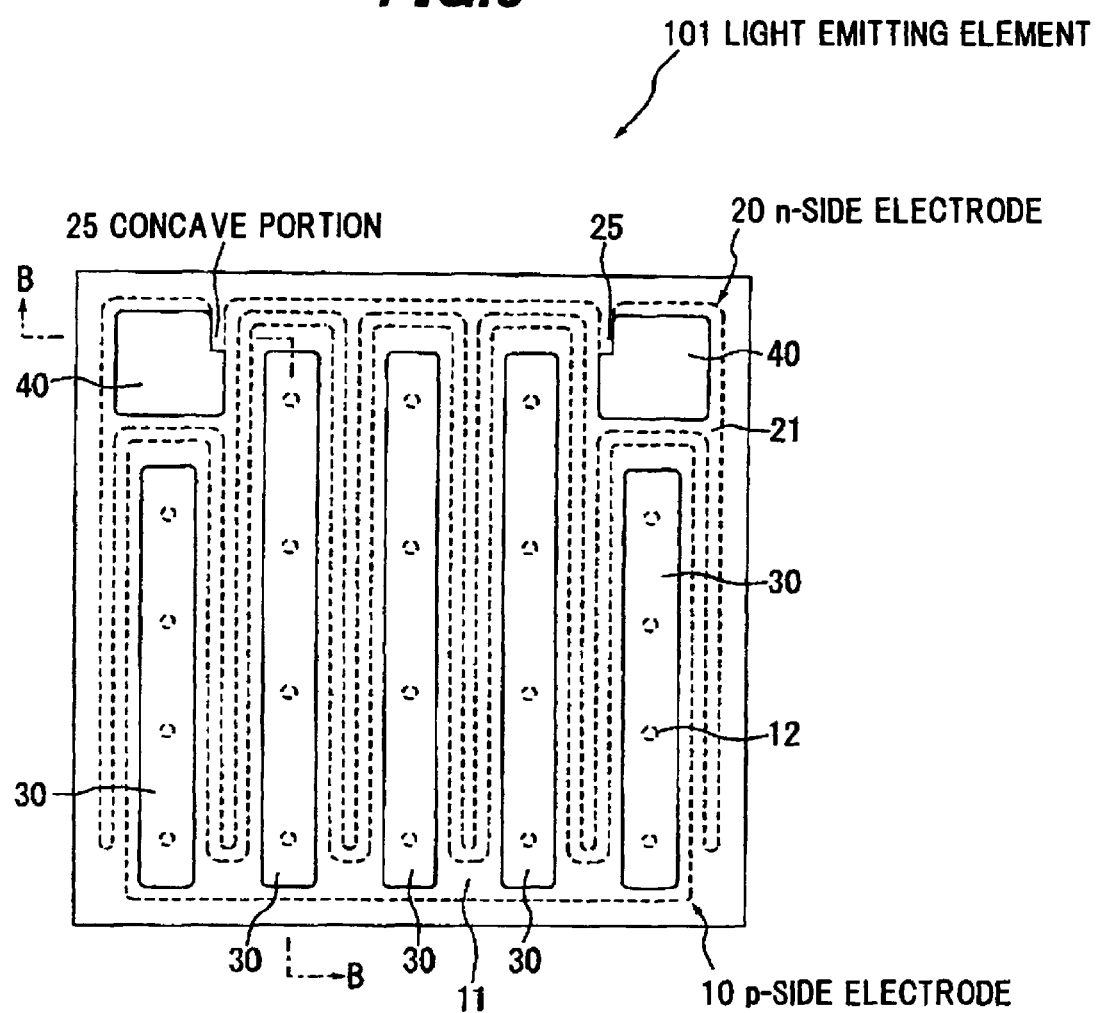

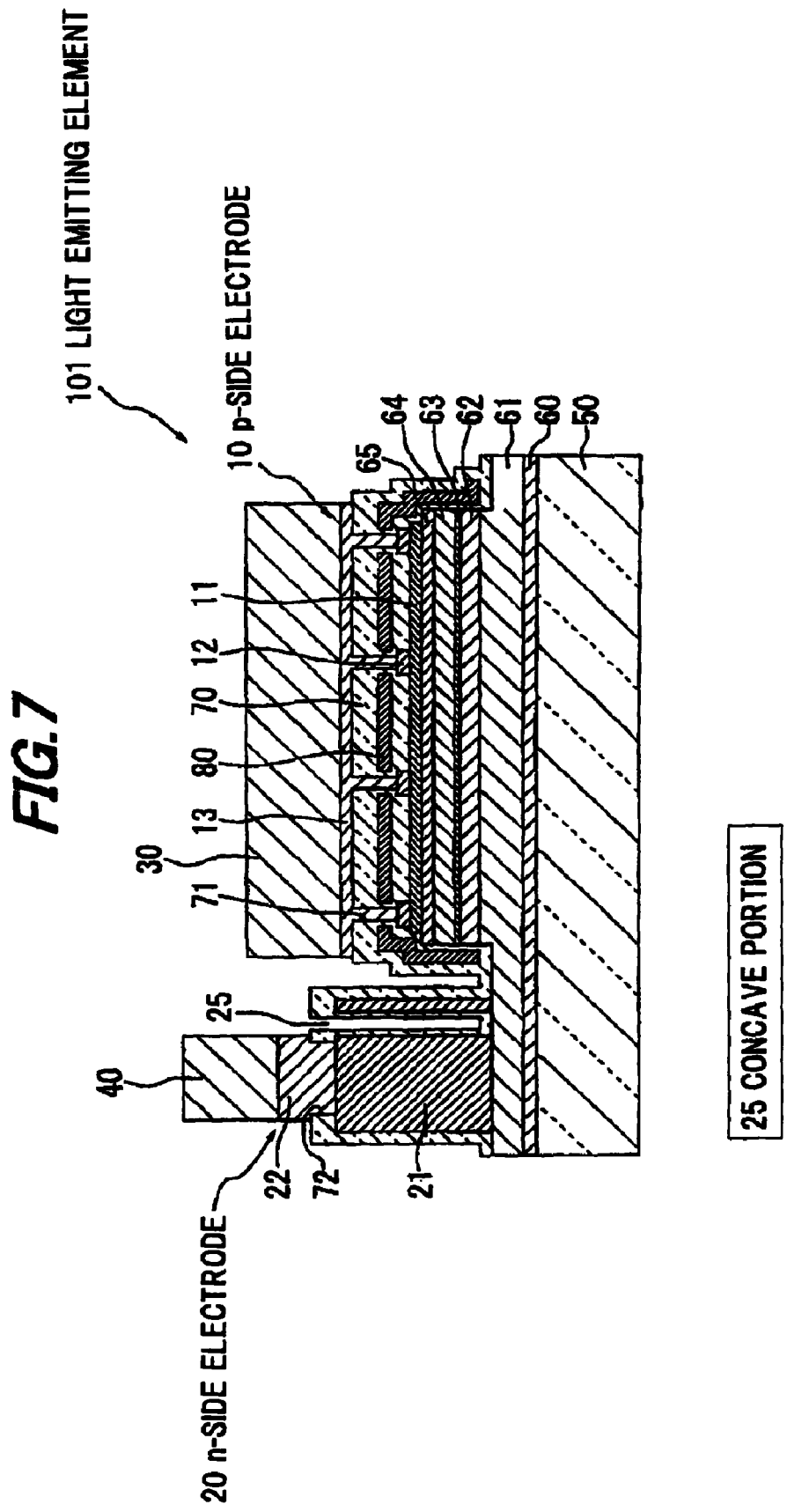

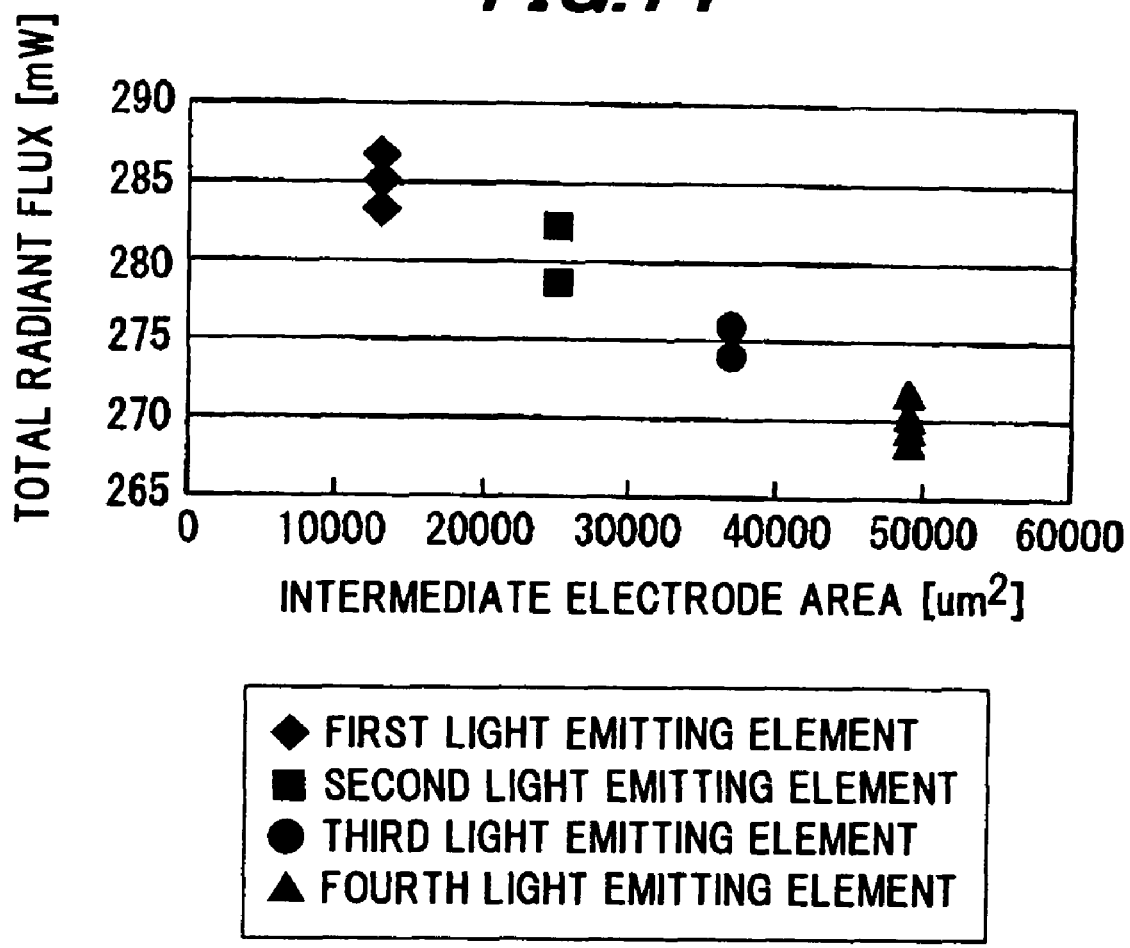

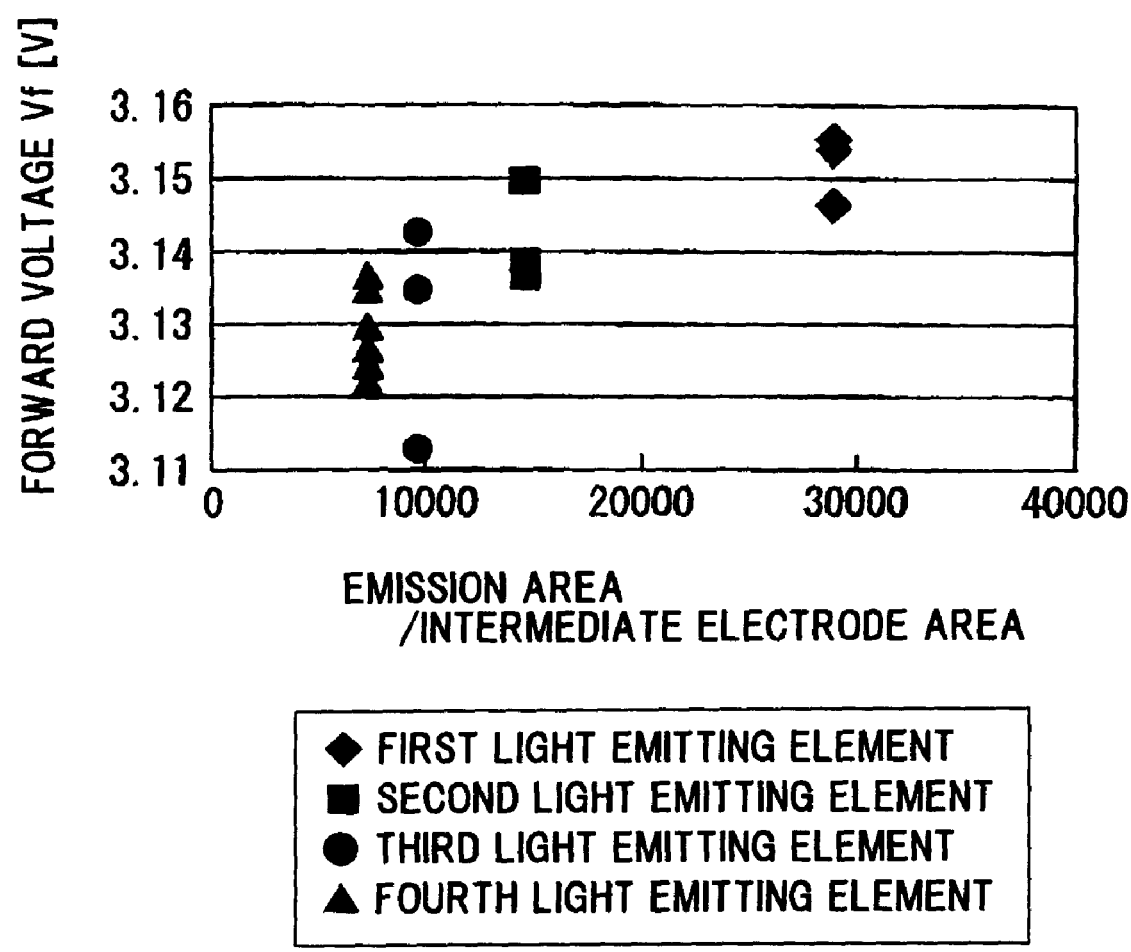

LIGHT EMITTING ELEMENT AND METHOD OF MAKING THE SAME

The present application is based on Japanese patent application Nos. 2008-186776 and 2008-188855 filed Jul. 18, 2008 and Jul. 22, 2008, respectively, the entire contents of which are incorporated herein by reference.

BACKGROUND OF THE INVENTION

1. Field of the Invention

This invention relates to a light emitting element (e.g., an light-emitting diode (LED)) with two electrodes formed on the same side as well as a method of making the light emitting element. Further, the invention relates to a light emitting element that a spreading electrode is covered by an insulating layer and an intermediate electrode is formed on the spreading electrode.

2. Description of the Related Art

Conventionally, a light emitting element such as a flip-chip type LED is known in which n-side and p-side electrodes are formed on the same side (e.g., JP-A-11-191641, JP-A-2004-153110, JP-A-2004-266296). For example, in JP-A-11-191641, an n-side bump and a-side bump are formed on the n-side electrode and p-side electrode, respectively, and the top surface of the p-side bump is higher than that of the n-side bump. In JP-A-2004-153110 and JP-A-2004-266296, the top surface of the p-side bump is on the same level as that of the n-side bump.

On the other hand, a flip-chip type light emitting element is disclosed which is composed of a p-side spreading electrode, an intermediate electrode on the spreading electrode, a reflection layer on the spreading electrode except a region directly on the intermediate electrode and having a three layer structure of an insulating film, a reflection film and a insulating film, a joining electrode on the insulating film of the reflection layer for feeding current via the intermediate electrode to the spreading electrode (JP-A-2007-300063). Further, JP-A-2001-203386 discloses another light emitting element with plural intermediate electrodes.

However, in JP-A-11-191641, JP-A-2004-153110 and JP-A-2004-266296, where the n-side bump and the p-side bump are of a solder material for bonding the element to a mounting substrate, in case of mounting the light emitting element on the mounting substrate by using the solder material, the light emitting element may be insufficiently parallel to the mounting substrate when the top surface of the p-side bump with a larger area is higher than that of the n-side bump or even when the top surface of the p-side bump is on the same level as that of the n-side bump. In this case, the n-side bump may be unsuccessfully bonded to an electrode pattern on the mounting substrate or voids may be occurred in the n-side bump.

On the other hand, in JP-A-2001-203386, the plural intermediate electrodes may cause difficulty in feeding uniformly current to the entire spreading electrode and thus a decrease in luminous efficiency.

SUMMARY OF THE INVENTION

It is an object of the invention to provide a light emitting element that can prevent a bond failure or occurrence of voids at an electrode side with smaller area when being bump-bonded to a mounting substrate etc. as well as a method of making the light emitting element.

Further, it is an object of the invention to provide a flip-chip type light emitting element that can feed uniformly current to the entire spreading electrode to enhance luminous efficiency thereof.

(1) According to one embodiment of the invention, a light emitting element comprises:
a first electrode;
a second electrode formed on a same side as the first electrode and comprising an area less than the first electrode;
a first bump formed on the first electrode; and
a second bump formed on the second electrode and comprising a level at a top thereof higher than that of the first bump.

In the above embodiment (1), the following modifications, changes and a combination thereof can be made.

(i) The second electrode comprises a concave portion on an upper surface thereof for receiving a melt of the second bump.

(ii) The light emitting element further comprises:
group III nitride semiconductor layers including an n-type contact layer, an n-type cladding layer, a light-emitting layer, a p-type cladding layer and a p-type contact layer,
wherein the first electrode is formed on the p-type contact layer, and
the second electrode is formed on the n-type contact layer.

(2) According to another embodiment of the invention, a method of making a light emitting element comprises:
growing, on a growth substrate, group III nitride semiconductor layers including an n-type contact layer, an n-type cladding layer, a light-emitting layer, a p-type cladding layer and a p-type contact layer;
removing a part of the p-type contact layer, the p-type cladding layer, the light-emitting layer, and the n-type cladding layer to expose the n-type contact layer;
forming a p-side electrode on the p-type contact layer;
forming an n-side electrode on the n-type contact layer, the n-side electrode comprising an area less than that of the p-side electrode;
forming a p-side bump on the p-side electrode; and
forming an n-side bump on the n-side electrode, the n-side bump comprising a level at a top thereof higher than that of the p-side bump.

In the above embodiment (2), the following modifications, changes and a combination thereof can be made.

(iii) The method further comprises:
forming a concave portion on an upper surface of the n-side electrode for receiving a melt of the n-side bump.

(3) According to another embodiment of the invention, a flip-chip type light emitting element comprises:
a spreading electrode for feeding current to a light-emitting layer, the spreading electrode comprising an extended part extending in a predetermined direction;
a plurality of intermediate electrodes formed on the spreading electrode and arranged in a longitudinal direction of the extended part and centrally in a width direction of the extended part;
an insulating layer formed on the spreading electrode; and
a joining electrode formed on the insulating layer for feeding current through the plurality of intermediate electrodes to the spreading electrode,
wherein the plurality of intermediate electrodes are disposed such that a distance of half a pitch thereof in the longitudinal direction is equal to or shorter than a distance from one of the plurality of intermediate electrodes to an edge of the extended part.

In the above embodiment (3), the following modifications, changes and a combination thereof can be made.

(iv) The spreading electrode is shaped like teeth of a comb in a top view, wherein a plurality of the extended parts are arranged in the width direction.

(v) The plurality of intermediate electrodes are each shaped like a circle in a top view with a diameter of not less than 20 µm and less than 80 µm.

Points of the Invention

According to one embodiment of the invention, a light emitting element is constructed such that the top of the n-side bump of the n-side electrode with a smaller area is at a higher level than that of the p-side bump. Therefore, there is no problem such as voids or bond failure occurred due to the insufficient amount of the n-side bump when mounting the element, so that the light emitting element can secure the reliability and heat radiation property etc.

According to another embodiment of the invention, a flip-chip type light emitting element is constructed such that the intermediate electrodes are each disposed centrally in the width direction of the extended part, and unit distance 'a' is made to be nearly equal to a distance 'b' to the edge of the intermediate electrode. Therefore, when current is fed through the joining electrode to the spreading electrode, current can be uniformly fed wholly to the spreading electrode to increase the light output of the light emitting element.

BRIEF DESCRIPTION OF THE DRAWINGS

The preferred embodiments according to the invention will be explained below referring to the drawings, wherein:

FIG. 1 is a top view showing a light emitting element in a first preferred embodiment according to the invention;

FIG. 2 is a cross sectional view cut along the line A-A in FIG. 1;

FIG. 3A is a cross sectional view showing the light emitting element before etching for exposing the surface of an n-side contact layer, FIG. 3B is a cross sectional view showing the light emitting element after etching for exposing the surface of the n-side contact layer, FIG. 3C is a cross sectional view showing the light emitting element in which a mask is formed on a spreading electrode, and FIG. 3D is a cross sectional view showing the light emitting element after etching spreading electrode;

FIG. 4A is a cross sectional view showing the light emitting element in which an n-side ohmic electrode is formed, FIG. 4B is a cross sectional view showing the light emitting element in which an intermediate electrode is formed, and FIG. 4C is a cross sectional view showing the light emitting element in which a reflection portion is formed;

FIG. 5A is a cross sectional view showing the light emitting element in which an insulating portion is formed on the reflection portion, FIG. 5B is a cross sectional view showing the light emitting element in which openings are formed in the insulating portion, and FIG. 5C is a cross sectional view showing the light emitting element in which a joining electrode is formed;

FIG. 6 is a top view showing a light emitting element in a second preferred embodiment according to the invention;

FIG. 7 is a cross sectional view cut along the line B-B in FIG. 6;

FIG. 11A is a cross sectional view showing the light emitting element before etching for exposing the surface of an n-side contact layer, FIG. 11B is a cross sectional view showing the light emitting element after etching for exposing the surface of the n-side contact layer, FIG. 11C is a cross sectional view showing the light emitting element in which a mask is formed on a spreading electrode, and FIG. 11D is a cross sectional view showing the light emitting element after etching spreading electrode;

FIG. 12A is a cross sectional view showing the light emitting element in which an n-side ohmic electrode is formed, FIG. 12B is a cross sectional view showing the light emitting element in which an intermediate electrode is formed, and FIG. 12C is a cross sectional view showing the light emitting element in which a reflection portion is formed;

FIG. 13A is a cross sectional view showing the light emitting element in which an insulating portion is formed on the reflection portion, FIG. 13B is a cross sectional view showing the light emitting element in which openings are formed in the insulating portion, and FIG. 13C is a cross sectional view showing the light emitting element in which a joining electrode is formed;

FIG. 14 is a graph showing data obtained from examples of the invention, where the horizontal scale represents a total area of the intermediate electrode and the vertical scale represents a total radiant flux of light emitted from the light emitting element;

FIG. 15 is a graph showing data obtained from examples of the invention, where the horizontal scale represents a value of a total area of the spreading electrode divided by a total area of the intermediate electrode and the vertical scale represents a forward voltage needed to emit the light emitting element;

DETAILED DESCRIPTION OF THE PREFERRED EMBODIMENTS

First Embodiment

Figure 3A:
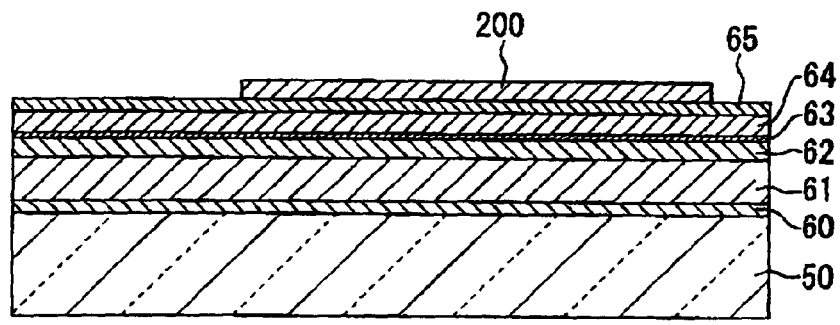
FIGS. 3A to 3D show a process in a production method of the light emitting element, where
Figure 3B:
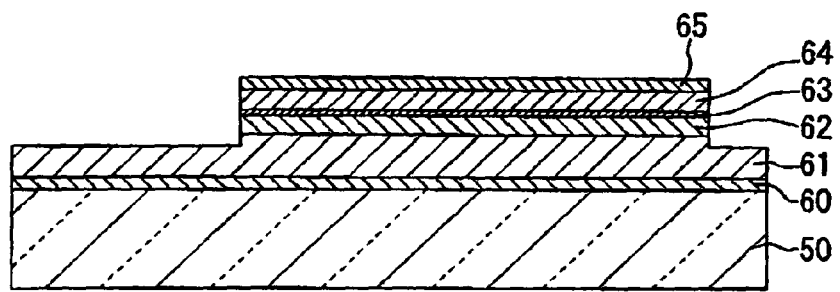
Figure 3C:
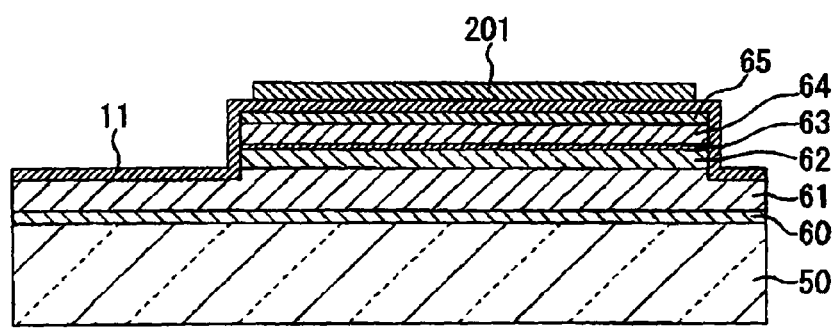
Figure 3D:
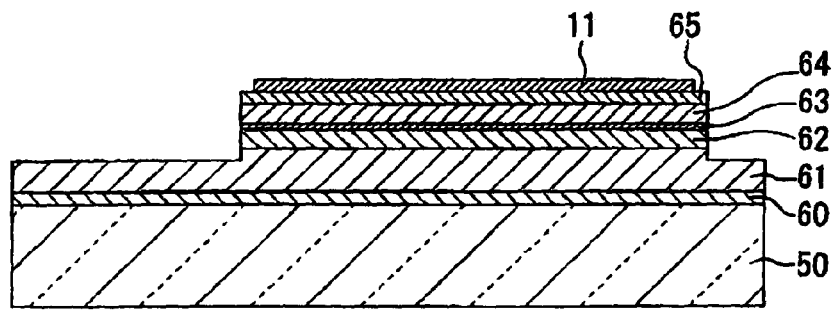

FIGS. 1 to 5 show a light emitting element in the first preferred embodiment according to the invention, where FIG. 1 is a top view showing the light emitting element.

As shown in FIG. 1, the light emitting element 1 is a flip-chip type LED (light-emitting diode) for emitting light with a wavelength in blue region. The light emitting element 1 emits light with a peak wavelength of 470 nm at a forward voltage of 3.5 V and a forward current of 20 mA. The light emitting element 1 is formed rectangular (top view). The planar dimensions (top view) of the light emitting element 1 are nearly 1.0 mm in height and width, respectively.

The light emitting element 1 is composed of a p-side electrode 10 as a first electrode and an n-side electrode 20 as a second electrode, a p-side bump 30 as a first bump formed on the p-side electrode 10, an n-side bump 40 as a second bump formed on the n-side electrode 20. The light emitting element 1 is of flip-chip type, in which the p-side electrode 10 and the n-side electrode 20 are formed on the same surface, and nearly square (top view).

The p-side electrode 10 has an area (top view) greater than that of the n-side electrode 20. In this embodiment, a spreading electrode 11 of the p-side electrode 10 is comb-shaped (top view), and plural p-side bumps 30 which are elongate and parallel to each other are formed via the joining electrode 13 (not shown in FIG. 1) on parts corresponding to the comb teeth of the spreading electrode 11. The joining electrodes 13 and the p-side bumps 30 at both ends in the width direction are shorter than the other ones.

An ohmic electrode 21 of the n-side electrode 20 is formed alongside the mesa portion of the p-side electrode 10. The n-side bump 40 is formed via the joining electrode 22 (not shown in FIG. 1) on the ohmic electrode 21. In this embodiment, the joining electrode 22 and the n-side bump 40 of the n-side electrode 20 are formed at two corners (top view) of the light emitting element 1, and opposite (top view) the end of the short-formed p-side joining electrode 13 and the p-side bump 30.

FIG. 2 is a cross sectional view cut along the line A-A in FIG. 1.

As shown in FIG. 2, light emitting element 1 is composed of a sapphire substrate 50 with a (0001) plane, a buffer layer 60 formed on the sapphire substrate 50, an n-side contact layer 61 formed on the buffer layer 60, an n-side cladding layer 62 formed on the n-side contact layer 61, a light-emitting layer 63 formed on the n-side cladding layer 62, a p-side cladding layer 64 formed on the light-emitting layer 63, and a p-side contact layer 65 formed on the p-side cladding layer 64.

The buffer layer 60, the n-side contact layer 61, the n-side cladding layer 62, the light-emitting layer 63, the p-side cladding layer 64 and the p-side contact layer 65 are each formed of a group III nitride compound semiconductor. The buffer layer 60 through the p-side contact layer 65 are produced by, e.g., MOCVD (metal organic chemical vapor deposition), MBE (molecular beam epitaxy), HVPE (halide vapor phase epitaxy) etc.

In this embodiment, the buffer layer 60 is formed of AlN. The n-side contact layer 61 and the n-side cladding layer 62 are formed of n-GaN doped with Si as an n-type dopant at a predetermined amount. The light-emitting layer 63 has a multiquantum well structure composed of $In_xGa_{1-x}N/GaN$. The p-side cladding layer 64 and the p-side contact layer 65 are formed of p-GaN doped with Mg as a p-type dopant at a predetermined amount. The buffer layer 60 may be formed of GaN, and the light-emitting layer 63 may have a single quantum well structure instead of the multiquantum well structure.

The p-side electrode 10 of the light emitting element 1 is composed of the spreading electrode 11 on the p-side contact layer 65, and an intermediate electrode 12 formed in a partial region on the spreading electrode 11. The spreading electrode 11 is covered with an insulating portion 70 except at a site of the intermediate electrode 12, and a reflection portion 80 is disposed in the insulating portion 70. The insulating portion 70 has openings 71 for exposing the intermediate electrode 12. The p-side electrode 10 is further composed of the joining electrode 13 for covering the top surface of the insulating portion 70 and contacting the intermediate electrode 12.

In this embodiment, the spreading electrode 11 of the p-side electrode 10 is a transparent electrode formed of ITO (indium tin oxide). The insulating portion 70 is of silicon dioxide ($SiO_2$). The reflection portion 80 is of aluminum (Al). The insulating portion 70 may be of a metal oxide such as titanium oxide ($TiO_2$), alumina ($Al_2O_3$), tantalum pentoxide ($Ta_2O_5$) etc. or an insulating resin material such as polyimide etc. The reflection portion 80 may be of Ag or an alloy including Al or Ag as a main component. The reflection portion 80 may be a DBR (distributed Bragg reflector) formed with multiple layers composed of two materials with different refractive index.

The intermediate electrode 12 is composed of a Ni layer formed contacting the spreading electrode 11, an Al layer formed contacting the joining electrode 13, and an Au layer formed between the Ni layer and the Al layer.

The joining electrode 13 is composed of a contact metal contacting the insulating portion 70 and the intermediate electrode 12, a first barrier metal as a diffusion preventing portion formed on the contact metal, a second barrier metal as a diffusion preventing portion formed on the first barrier metal, a third barrier metal as a diffusion preventing portion formed on the second barrier metal, and a solder electrode formed on the third barrier metal. In this embodiment, the contact metal is of Ti, the first and third barrier metals are of Ni, the second barrier metal is of Ti, and the solder electrode is of an alloy material including Au and Sn fusible at a predetermined temperature.

The p-side bump 30 with a predetermined height is formed on the joining electrode 13. In this embodiment, the p-side bump 30 is formed of Au—Sn solder with Au on the surface.

The n-side electrode 20 is composed of the ohmic electrode 21 formed on the n-side contact layer 61, and the joining electrode 22 formed on the ohmic electrode 21. The ohmic electrode 21 is composed of at least one metal selected from the group consisting of Ti, Al, Pd, Pt, V, Ir and Rh. The insulating portion 70 covers the n-side contact layer 61 except at a formation site of the ohmic electrode 21. The insulating portion 70 includes openings 72 for exposing the ohmic electrode 21.

The joining electrode 22 is composed of a contact metal contacting the ohmic electrode 21, a first barrier metal as a diffusion preventing portion formed on the contact metal, a second barrier metal as a difflusion preventing portion formed on the first barrier metal, a third barrier metal as a diffusion preventing portion formed on the second barrier metal, and a solder electrode formed on the third barrier metal. In this embodiment, the contact metal is of Ti, the first and third barrier metals are of Ni, the second barrier metal is of Ti, and the solder electrode is of an alloy material including Au and Sn fusible at a predetermined temperature. In this embodiment, the joining electrode 22 of the n-side electrode 20 has the same layer composition and thickness as the joining electrode 13 of the p-side electrode 10.

The p-side bump 30 and the n-side bump 40 are formed of Au—Sn solder and formed on the joining electrodes 13, 22, respectively, by plating, screen printing, sputtering, vacuum deposition etc. The joining electrode 22 of the n-side electrode 20 is smaller (top view) than the joining electrode 13 of the p-side electrode 10, and the n-side bump 40 on the joining electrode 22 with a smaller area is higher than the p-side bump 30. In this embodiment, although the p-side bump 30 and the n-side bump 40 have the same height dimension, they are made to be different in height level. The n-side bump 40 is formed to be at a higher level than the p-side bump 30 in consideration of the production error so that the p-side bump 30 cannot be at a higher level than the n-side bump 40 even upon causing the production error.

Process for Making the Light Emitting Element 1

FIGS. 3A to 5C show an example of a process for making the light emitting element 1 of the first embodiment. FIG. 3A is a cross sectional view showing the light emitting element before etching for exposing the surface of an n-side contact layer. FIG. 3B is a cross sectional view showing the light emitting element after etching for exposing the surface of the n-side contact layer. FIG. 3C is a cross sectional view showing the light emitting element in which a mask is formed on a spreading electrode. FIG. 3D is a cross sectional view showing the light emitting element after etching spreading electrode.

First, a sapphire substrate 50 is provided, and epitaxially grown on the sapphire substrate 50 are the buffer layer 60, the n-side contact layer 61, the n-side cladding layer 62, the light-emitting layer 63, the p-side cladding layer 64, and the p-side contact layer 65 in this order to formed an epitaxial growth substrate.

Then, a mask 200 of photoresist is formed on the p-side contact layer 65 by photolithography (See FIG. 3A). Then, a part except the formation area of the mask 200 is etched in the depth direction from the p-side contact layer 65 to a part of the n-side contact layer 61, and the mask 200 is then removed. Thereby, a mesa portion is formed which is compose of multiple compound semiconductor layers, i.e., the n-side cladding layer 62 through the p-side contact layer 65 (See FIG. 3B).

Then, the spreading electrode 11 is formed wholly on the n-side contact layer 61 and the p-side contact layer 65. In this embodiment, the spreading electrode 11 is of ITO and formed by vacuum deposition. Instead, the spreading electrode 11 may be formed by sputtering, CVD, sol-gel method etc. Then, a mask 201 of photoresist is formed in a region where the spreading electrode 11 is to be left (See FIG. 3C). Then, a region not covered by the mask 201 on the spreading electrode 11 is etched. Thereby, the spreading electrode 11 is formed at a predetermined region on the p-side contact layer 65 (See FIG. 3D).

Figure 4A:
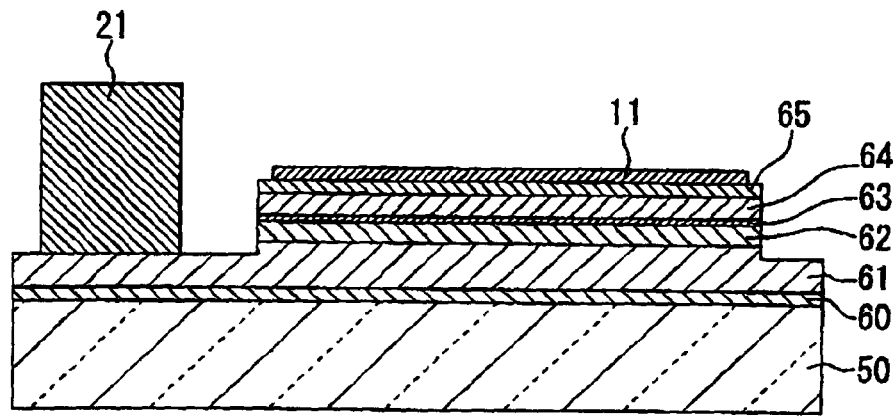
FIGS. 4A to 4C show a subsequent process in the production method of the light emitting element, where
Figure 4B:
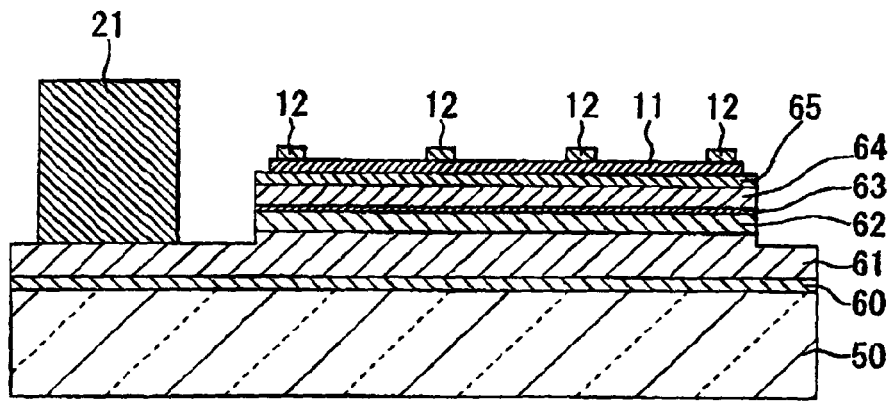
Figure 4C:
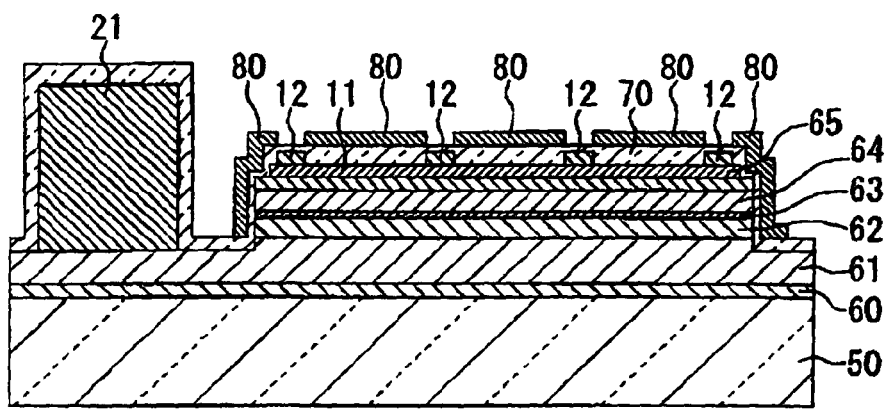

FIG. 4A is a cross sectional view showing the light emitting element in which an n-side ohmic electrode is formed. FIG. 4B is a cross sectional view showing the light emitting element in which an intermediate electrode is formed. FIG. 4C is a cross sectional view showing the light emitting element in which a reflection portion is formed.

Then, the ohmic electrode 21 is formed at a predetermined region of the n-side contact layer 61 by vacuum deposition and photolithography (See FIG. 4A). Here, a non-heated material for the ohmic electrode 21 may be first formed on the n-side contact layer 61 and the ohmic electrode 21 may be then heated.

Then, the intermediate electrode 12 is formed at a predetermined position of the spreading electrode 11 by vacuum deposition and photolithography (See FIG. 4B). The ohmic electrode 21 and the intermediate electrode 12 are made such that the top of the ohmic electrode 21 is at a higher level than that of the intermediate electrode 12. In this embodiment, the level difference at the top between the ohmic electrode 21 and the intermediate electrode 12 at this stage corresponds to that between the p-side bump 30 and the n-side bump 40. Then, the insulating portion 70 covering the n-side contact layer 61, the ohmic electrode 21, the mesa portion, the spreading electrode 11 and the intermediate electrode 12 is formed by vacuum deposition. Then, the reflection portion 80 is formed at a predetermined region on the insulating portion 70 except the intermediate electrode 12 and the ohmic electrode 21 by vacuum deposition and photolithography (See FIG. 4C).

Figure 5A:
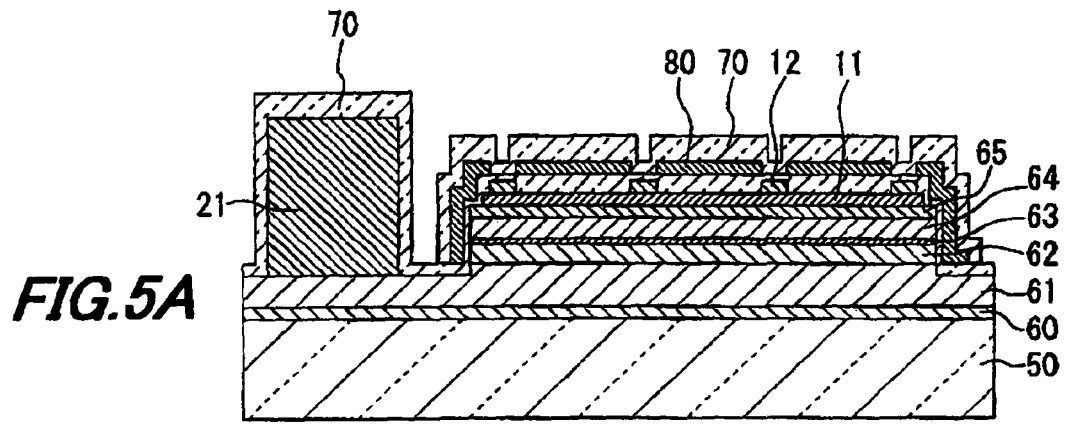
FIGS. 5A to 5C show a subsequent process in the production method of the light emitting element, where
Figure 5B:
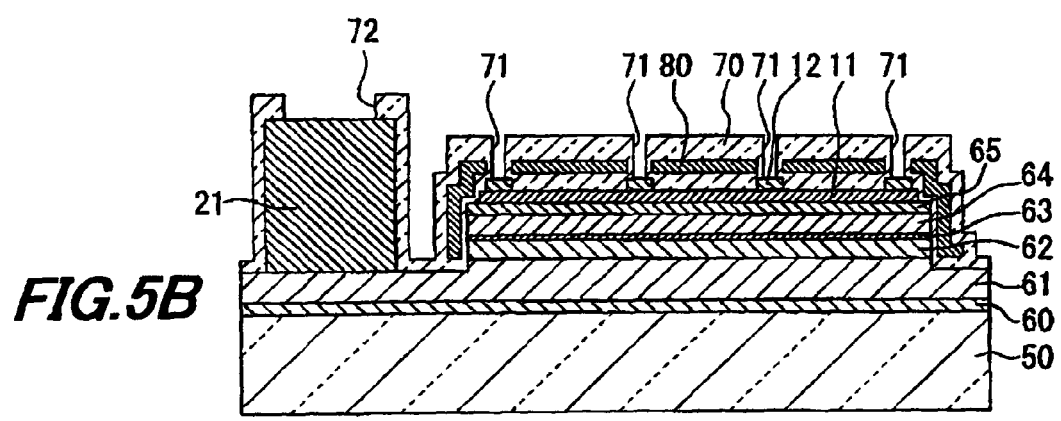
Figure 5C:
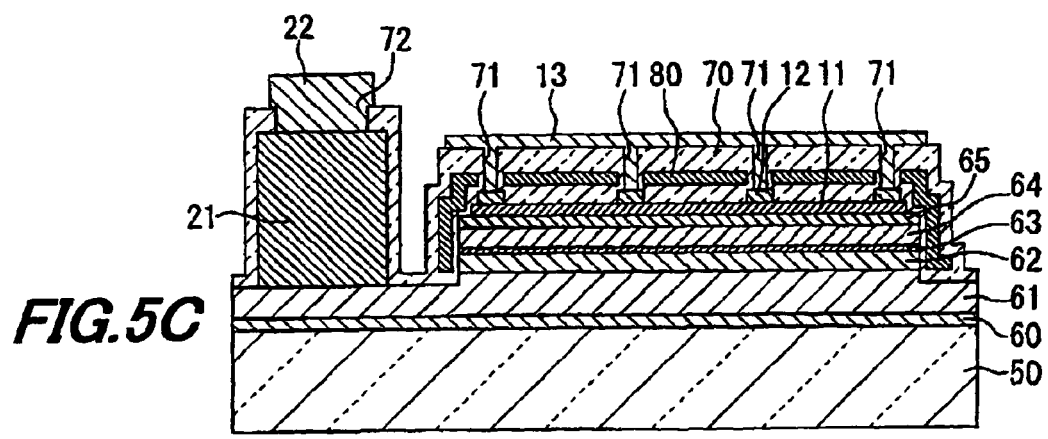

FIG. 5A is a cross sectional view showing the light emitting element in which an insulating portion is formed on the reflection portion. FIG. 5B is a cross sectional view showing the light emitting element in which openings are formed in the insulating portion. FIG. 5C is a cross sectional view showing the light emitting element in which a joining electrode is formed.

Then, the insulating portion 70 is further formed wholly on the element (See FIG. 5A). Then, the insulating portion 70 on the ohmic electrode 21 and on the intermediate electrode 12 is removed by photolithography and etching. Thereby, the opening 71 is formed on the intermediate electrode 12 and the opening 72 is formed on the ohmic electrode 21 (See FIG. 5B).

The p-side joining electrode 13 and the n-side joining electrode 22 are formed in the opening 71 and the opening 72, respectively, by vacuum deposition and photolithography (See FIG. 5C). In this embodiment, the p-side joining electrode 13 and the n-side joining electrode 22 are simultaneously produced at the same process so that they have the same height (vertical) dimension. The n-side contact layer 61, the intermediate electrode 12 and the joining electrodes 13, 22 may be also formed by sputtering. The insulating portion 70 may be also formed by CVD (chemical vapor deposition).

Then, Au—Sn solder is formed on the joining electrodes 13, 22 by plating to provide the p-side bump 30 and the n-side bump 40. Thereby, the light emitting element 1 can be produced such that the top of the n-side bump 40 is at a higher level than that of the p-side bump 30 (FIG. 2). In this embodiment, the p-side bump 30 and the n-side bump 40 are simultaneously produced at the same process so that they have the same height (vertical) dimension.

The light emitting element 1 thus produced is flip-chip bonded at a predetermined position of a submount of ceramics and with a conductive material wiring pattern formed thereon. Here, since the top of the n-side bump 40 is at a higher level than that of the p-side bump 30, the n-side bump 40 can be surely bonded to the wiring pattern on the submount. Further, since the p-side bump 30 has a volume greater than the n-side bump 40 although the p-side bump 30 is at a level lower than the n-side bump 40, the p-side bump 30 can be also surely bonded to the wiring pattern on the submount. Then, the light emitting element 1 mounted on the submount is sealed with a sealing material such as epoxy resin or glass to provide the packaged light emitting element 1.

Effects of the First Embodiment

The light emitting element 1 thus produced is constructed such that the top of the n-side bump 40 of the n-side electrode 20 with a smaller area is at a higher level than that of the p-side bump 30. Therefore, there is no problem such as voids or bond failure occurred due to the insufficient amount of the n-side bump 40 when mounting the element, so that the light emitting element 1 can secure the reliability and heat radiation property etc.

In this embodiment, an example is exhibited in which the area of the p-side electrode is relatively large, and the p-side electrode and the n-side electrode are assigned to the first electrode and the second electrode, respectively. By contrast, when the area of the n-side electrode is relatively large, the n-side electrode and the p-side electrode may be assigned to the first electrode and the second electrode, respectively. In this case, the top of the p-side electrode is made to be at a higher level than that of the n-side electrode.

Although in this embodiment the light emitting element is formed with the group III nitride semiconductor layers, it may be formed with the other semiconductor layers.

Second Embodiment

FIGS. 6 and 7 show the second preferred embodiment of the invention. FIG. 6 is a top view showing a light emitting element of the second embodiment.

As shown in FIG. 6, the light emitting element 101 of the second embodiment is different from the light emitting element 1 of the first embodiment in that the n-side electrode 20 is provided with a concave portion 25. The concave portion 25 is formed alongside the two n-side bumps 40 at the corner (top view). In this embodiment, the concave portion 25 is in the form of a groove that extends linearly in the direction from the outside to the inside (downside in FIG. 6) of the light emitting element 101.

FIG. 7 is a cross sectional view cut along the line B-B in FIG. 6.

As shown in FIG. 7, the concave portion 25 is formed by concaving a part of the joining electrode 22 of the n-side electrode 20 on the side of the p-side electrode 10. Thus, when the light emitting element 101 is mounted on the mounting substrate, a part of the fused n-side bump 40 flows into the concave portion 25. Therefore, short-circuit can be securely avoided that may occur between the n-side and the p-side due to the spill of the n-side bump 40.

Although in the second embodiment the concave portion 25 is in the form of a groove, it may be in any form.

Third Embodiment

Figure 8:
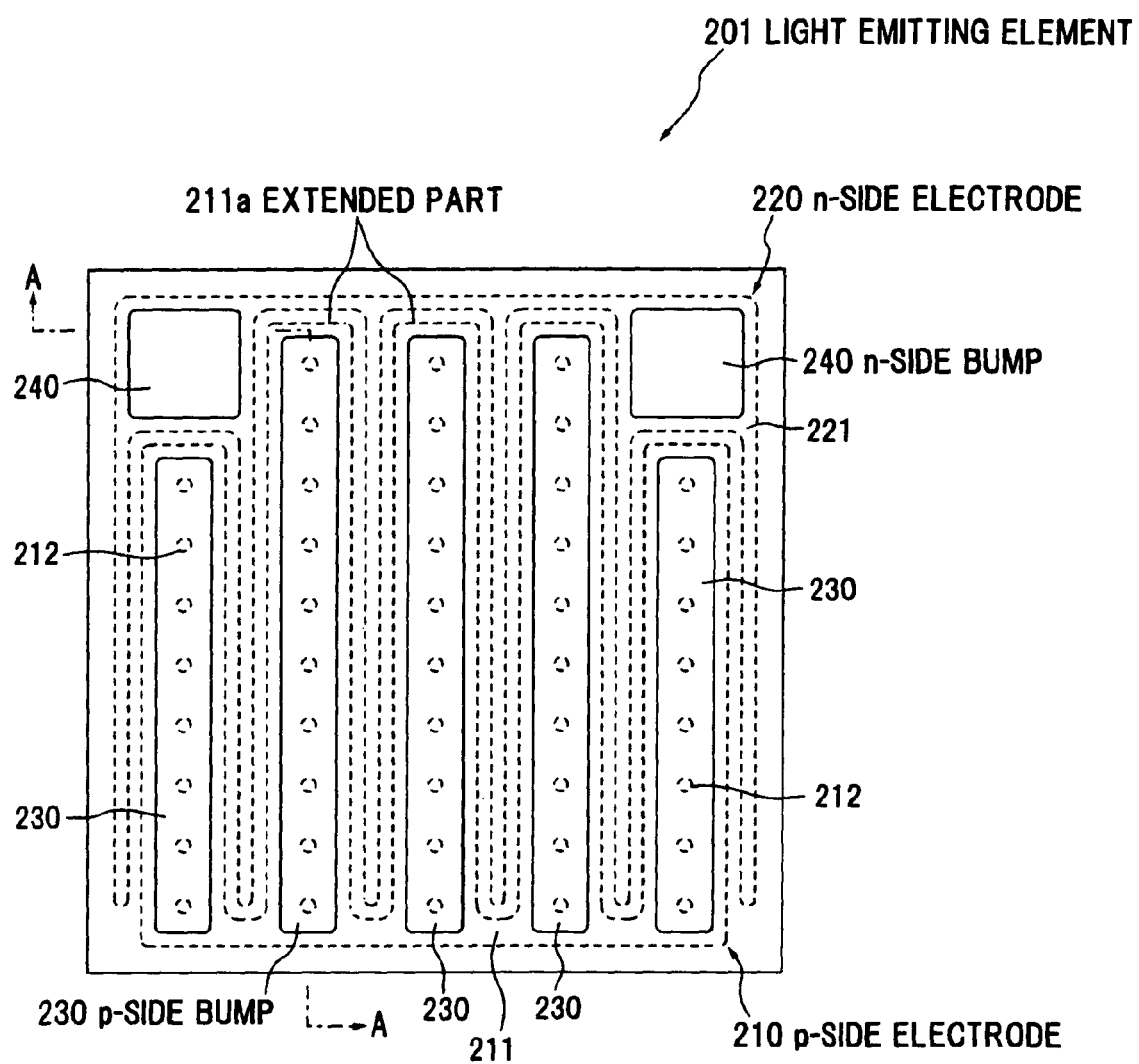
FIG. 8 is a top view showing a light emitting element in a third preferred embodiment according to the invention.

FIGS. 8 to 13C show the third preferred embodiment of the invention. FIG. 8 is a top view showing a light emitting element of the third embodiment.

As shown in FIG. 8, the light emitting element 201 is a flip-chip type LED (light-emitting diode) for emitting light with a wavelength in blue region. The light emitting element 201 emits light with a peak wavelength of 450 nm at a forward voltage of 3.2 V and a forward current of 350 mA. The light emitting element 201 is formed rectangular (top view). The planar dimensions (top view) of the light emitting element 201 are nearly 1.0 mm in height and width, respectively.

The light emitting element 201 is composed of a p-side electrode 210 as a first electrode and an n-side electrode 220 as a second electrode, a p-side bump 230 as a first bump formed on the p-side electrode 210, an n-side bump 240 as a second bump formed on the n-side electrode 220. The light emitting element 201 is of flip-chip type, in which the p-side electrode 210 and the n-side electrode 220 are formed on the same surface, and nearly square (top view).

The p-side electrode 210 has an area (top view) greater than that of the n-side electrode 220. In this embodiment, a spreading electrode 211 of the p-side electrode 210 is provided with an extended part 211a extending in a predetermined direction and comb-shaped (top view), and plural p-side bumps 230 which are elongate and parallel to each other are formed via the joining electrode 213 (not shown in FIG. 8) on parts corresponding to the comb teeth of the spreading electrode 211. The joining electrodes 213 and the p-side bumps 230 at both ends in the width direction are shorter than the other ones.

An ohmic electrode 221 of the n-side electrode 220 is formed alongside the mesa portion of the p-side electrode 210. The n-side bump 240 is formed via the joining electrode 222 (not shown in FIG. 8) on the ohmic electrode 221. In this embodiment, the joining electrode 222 and the n-side bump 240 of the n-side electrode 220 are formed at two corners (top view) of the light emitting element 201, and opposite (top view) the end of the short-formed p-side joining electrode 213 and the p-side bump 230.

Figure 9:
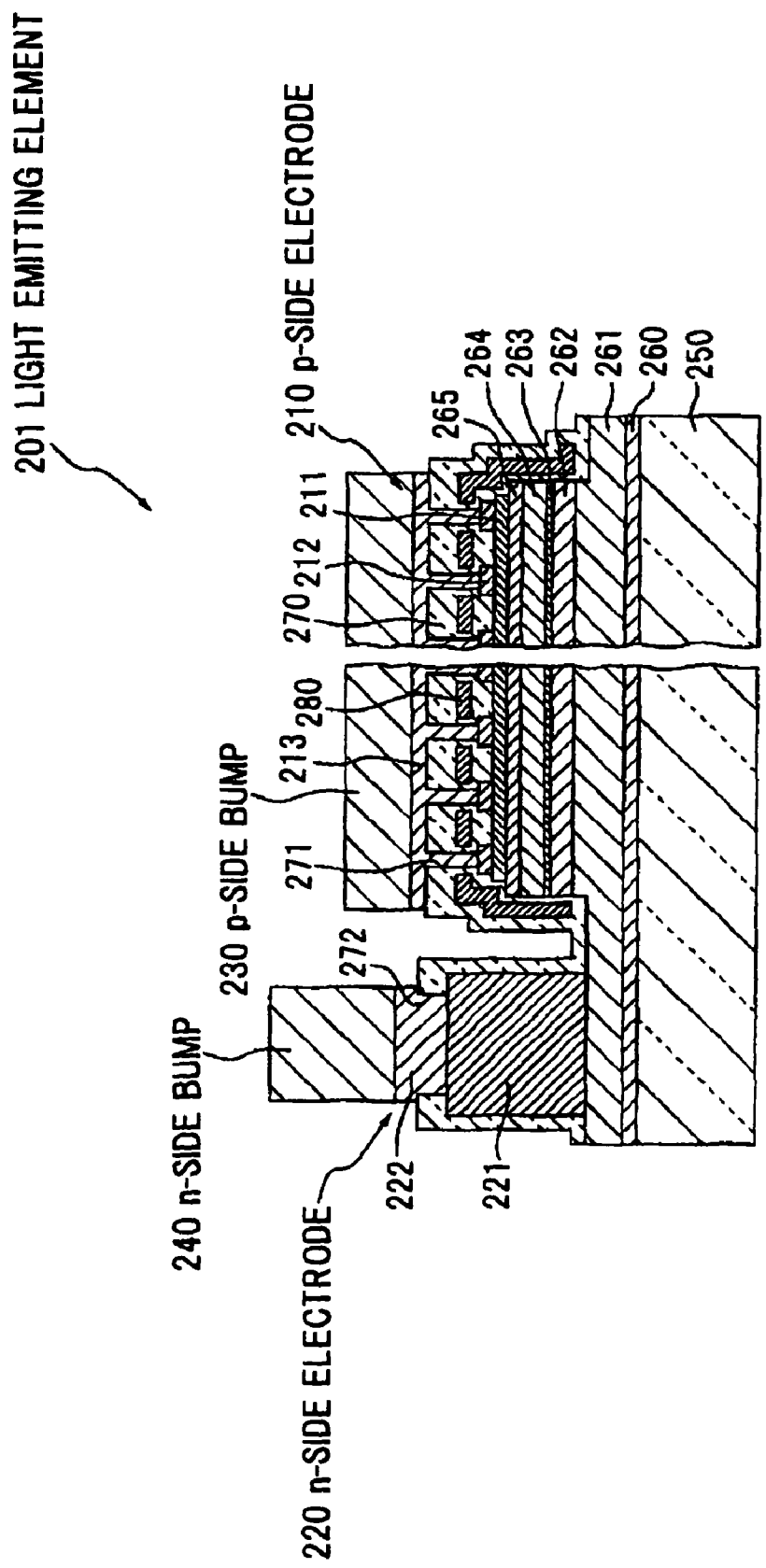
FIG. 9 is a cross sectional view cut along the line A-A in FIG. 8.

FIG. 9 is a cross sectional view cut along the line A-A in FIG. 8.

As shown in FIG. 9, light emitting element 201 is composed of a sapphire substrate 250 with a (0001) plane, a buffer layer 260 formed on the sapphire substrate 250, an n-side contact layer 261 formed on the buffer layer 260, an n-side cladding layer 262 formed on the n-side contact layer 261, a light-emitting layer 263 formed on the n-side cladding layer 262, a p-side cladding layer 264 formed on the light-emitting layer 263, and a p-side contact layer 265 formed on the p-side cladding layer 264.

The buffer layer 260, the n-side contact layer 261, the n-side cladding layer 262, the light-emitting layer 263, the p-side cladding layer 264 and the p-side contact layer 265 are each formed of a group III nitride compound semiconductor. The buffer layer 260 through the p-side contact layer 265 are produced by, e.g., MOCVD (metal organic chemical vapor deposition), MBE (molecular beam epitaxy), HVPE (halide vapor phase epitaxy) etc.

In this embodiment, the buffer layer 260 is formed of AlN. The n-side contact layer 261 and the n-side cladding layer 262 are formed of n-GaN doped with Si as an n-type dopant at a predetermined amount. The light-emitting layer 263 has a multiquantum well structure composed of $In_xGa_{1-x}N$/GaN. The p-side cladding layer 264 and the p-side contact layer 265 are formed of p-GaN doped with Mg as a p-type dopant at a predetermined amount. The buffer layer 260 may be formed of GaN, and the light-emitting layer 263 may have a single quantum well structure instead of the multiquantum well structure.

The p-side electrode 210 of the light emitting element 201 is composed of the spreading electrode 211 on the p-side contact layer 265, and an intermediate electrode 212 formed in a partial region on the spreading electrode 211. The spreading electrode 211 is covered with an insulating portion 270 except at a site of the intermediate electrode 212, and a reflection portion 280 is disposed in the insulating portion 270. The insulating portion 270 has openings 271 for exposing the intermediate electrode 212. The p-side electrode 210 is further composed of the joining electrode 213 for covering the top surface of the insulating portion 270 and contacting the intermediate electrode 212.

In this embodiment, the spreading electrode 211 of the p-side electrode 210 is a transparent electrode formed of ITO (indium tin oxide). The insulating portion 270 is of silicon dioxide ($SiO_2$). The reflection portion 280 is of aluminum (Al). The insulating portion 270 may be of a metal oxide such as titanium oxide ($TiO_2$), alumina ($Al_2O_3$), tantalum pentoxide ($Ta_2O_5$) etc. or an insulating resin material such as polyimide etc. The reflection portion 280 may be of Ag or an alloy including Al or Ag as a main component. The reflection portion 280 may be a DBR (distributed Bragg reflector) formed with multiple layers composed of two materials with different refractive index.

The intermediate electrode 212 is formed circular, and has a relatively small area of, e.g., less than 80 $\mu m^2$ (top view). The intermediate electrode 212 is composed of a Ni layer formed contacting the spreading electrode 211, an Al layer formed contacting the joining electrode 213, and an Au layer formed between the Ni layer and the Al layer.

The joining electrode 213 is composed of a contact metal contacting the insulating portion 270 and the intermediate electrode 212, a first barrier metal as a diffusion preventing portion formed on the contact metal, a second barrier metal as a diffusion preventing portion formed on the first barrier metal, a third barrier metal as a diffusion preventing portion formed on the second barrier metal, and a solder electrode formed on the third barrier metal. In this embodiment, the contact metal is of Ti, the first and third barrier metals are of Ni, the second barrier metal is of Ti, and the solder electrode is of an alloy material including Au and Sn fusible at a predetermined temperature.

The p-side bump 230 with a predetermined height is formed on the joining electrode 213. In this embodiment, the p-side bump 230 is formed of Au—Sn solder with Au on the surface.

The n-side electrode 220 is composed of the ohmic electrode 221 formed on the n-side contact layer 261, and the joining electrode 222 formed on the ohmic electrode 221. The ohmic electrode 221 is composed of at least one metal selected from the group consisting of Ti, Al, Pd, Pt, V, Ir and Rh. The insulating portion 270 covers the n-side contact layer 261 except at a formation site of the ohmic electrode 221. The insulating portion 270 includes openings 272 for exposing the ohmic electrode 221.

The p-side bump 230 and the n-side bump 240 are formed of Au—Sn solder and formed on the joining electrodes 213, 222, respectively, by plating, screen printing, sputtering, vacuum deposition etc. The joining electrode 222 of the n-side electrode 220 is smaller (top view) than the joining electrode 213 of the p-side electrode 210, and the n-side bump 240 on the joining electrode 222 with a smaller area is higher than the p-side bump 230. The n-side bump 240 is formed to be at a higher level than the p-side bump 230 in consideration of the production error so that the p-side bump 230 cannot be at a higher level than the n-side bump 240 even upon causing the production error.

Figure 10:
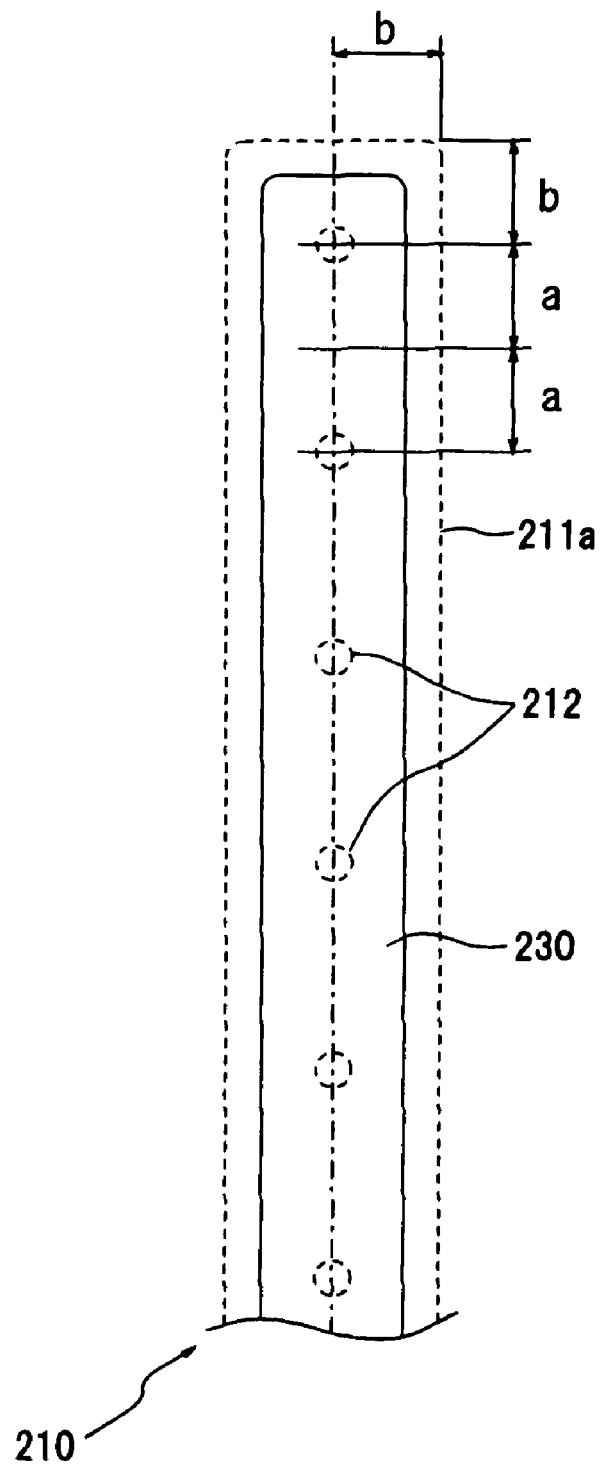
FIG. 10 is an enlarged top view showing a p-side electrode, a part of the light emitting element of the third embodiment.

FIG. 10 is an enlarged top view showing a p-side electrode, a part of the light emitting element of the third embodiment.

As shown in FIG. 10, the intermediate electrodes 212 are each disposed centrally in the width direction of the corresponding extended part 211a, and a distance 'a' (hereinafter called unit distance) of half the pitch in the longitudinal direction is made to be nearly equal to a distance 'b' to the edge of the extended part 211a of the spreading electrode 211. Herein, "the pitch in the longitudinal direction" is defined as a distance between the centers of the intermediate electrode 212, and "distance to the edge" is defined as a distance from the center of the intermediate electrode 212 to the edge of the extended part 211a. The unit distance 'a' for the intermediate electrode 212 may be shorter than the distance 'b'. In this embodiment, the unit distance 'a' is relatively as narrow as 65 μm The total area of the extended part 211a of the spreading electrode 211 is about 578000 μm$^2$ and one intermediate electrode 212 is provided in each 14450 m$^2$. Although in this embodiment one intermediate electrode 212 occupies an area of 615 m$^2$, the amount of light emitted from the light emitting element 201 increases according as the area decreases.

Process for Making the Light Emitting Element 201

Figure 11A:
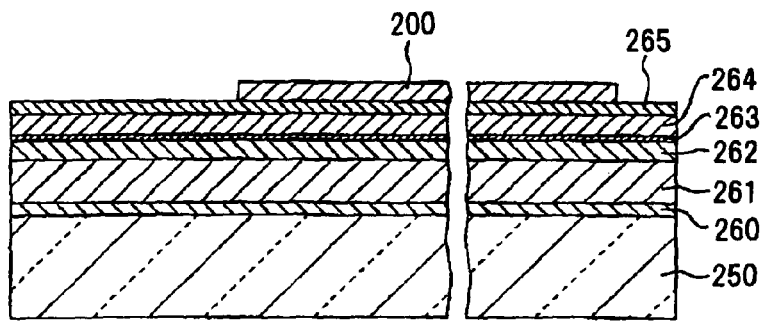
FIGS. 11A to 11D show a process in a production method of the light emitting element of the third embodiment, where
Figure 11B:
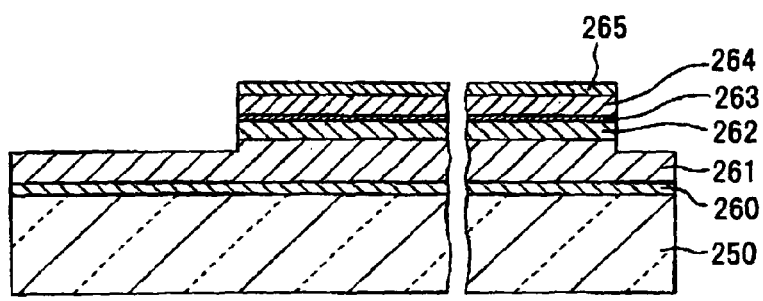
Figure 11C:
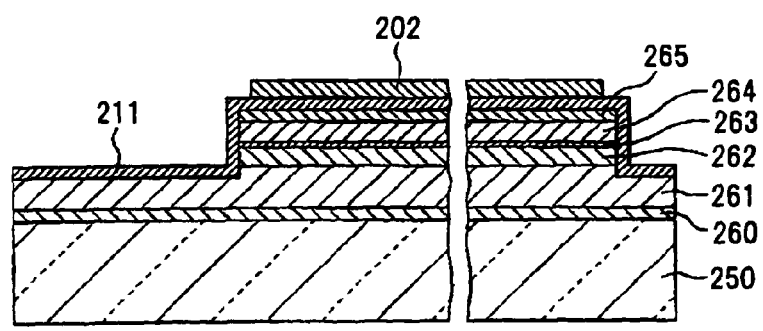
Figure 11D:
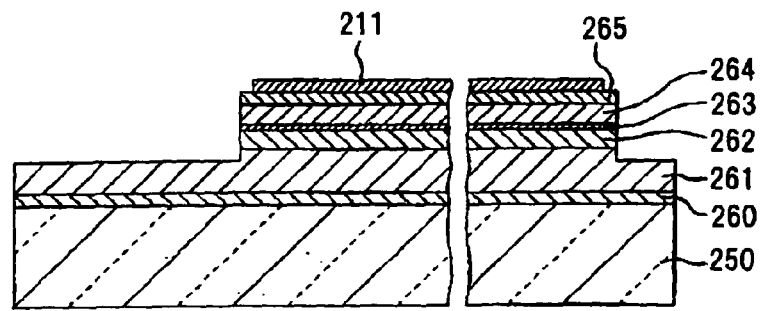

FIGS. 11A to 13C show an example of a process for making the light emitting element 201 of the first embodiment. FIG. 11A is a cross sectional view showing the light emitting element before etching for exposing the surface of an n-side contact layer. FIG. 11B is a cross sectional view showing the light emitting element after etching for exposing the surface of the n-side contact layer. FIG. 11C is a cross sectional view showing the light emitting element in which a mask is formed on a spreading electrode. FIG. 11D is a cross sectional view showing the light emitting element after etching spreading electrode.

First, a sapphire substrate 250 is provided, and epitaxially grown on the sapphire substrate 250 are the buffer layer 260, the n-side contact layer 261, the n-side cladding layer 262, the light-emitting layer 263, the p-side cladding layer 264, and the p-side contact layer 265 in this order to formed an epitaxial growth substrate.

Then, a mask 200 of photoresist is formed on the p-side contact layer 265 by photolithography (See FIG. 11A). Then, a part except the formation area of the mask 200 is etched in the depth direction from the p-side contact layer 265 to a part of the n-side contact layer 261, and the mask 200 is then removed. Thereby, a mesa portion is formed which is compose of multiple compound semiconductor layers, i.e., the n-side cladding layer 262 through the p-side contact layer 265 (See FIG. 11B).

Then, the spreading electrode 211 is formed wholly on the n-side contact layer 261 and the p-side contact layer 265. In this embodiment, the spreading electrode 211 is of ITO and formed by vacuum deposition. Instead, the spreading electrode 211 may be formed by sputtering, CVD, sol-gel method etc. Then, a mask 202 of photoresist is formed in a region where the spreading electrode 211 is to be left (See FIG. 11C). Then, a region not covered by the mask 202 on the spreading electrode 211 is etched. Thereby, the spreading electrode 211 is formed at a predetermined region on the p-side contact layer 265 (See FIG. 11D).

Figure 12A:
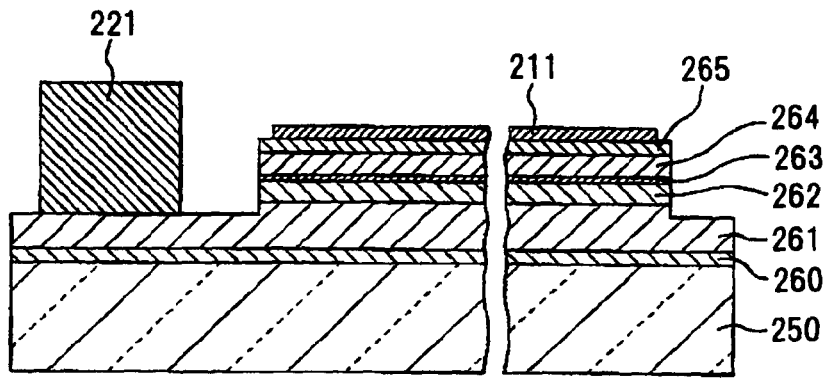
FIGS. 12A to 12C show a subsequent process in the production method of the light emitting element of the third embodiment, where
Figure 12B:
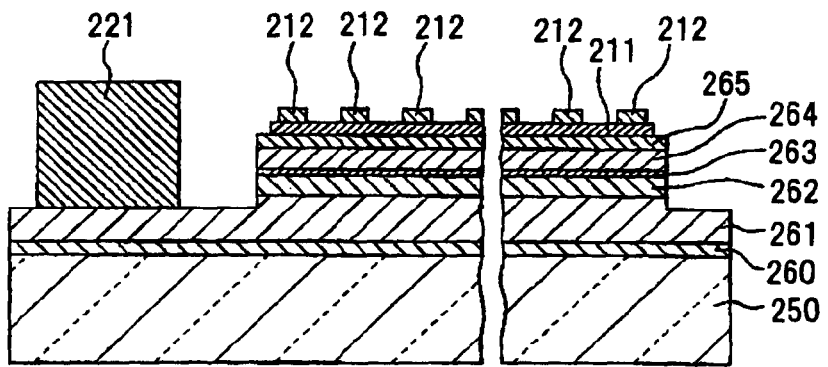
Figure 12C:
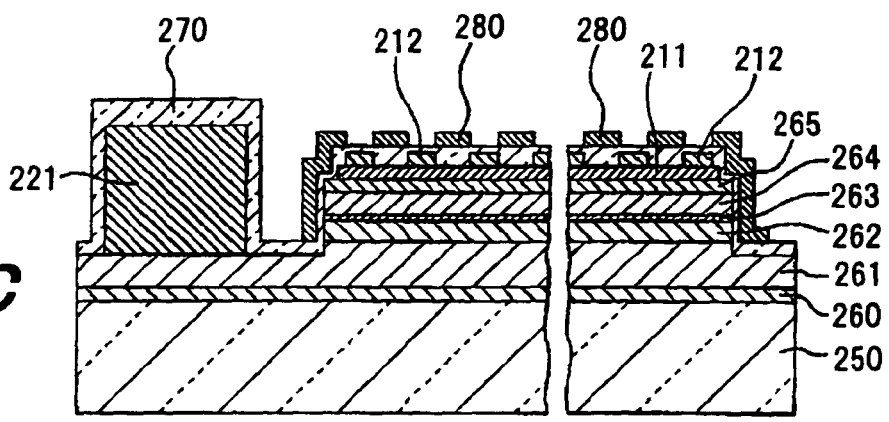

FIG. 12A is a cross sectional view showing the light emitting element in which an n-side ohmic electrode is formed. FIG. 12B is a cross sectional view showing the light emitting element in which an intermediate electrode is formed. FIG. 12C is a cross sectional view showing the light emitting element in which a reflection portion is formed.

Then, the ohmic electrode 221 is formed at a predetermined region of the n-side contact layer 261 by vacuum deposition and photolithography (See FIG. 12A). Here, a non-heated material for the ohmic electrode 221 may be first formed on the n-side contact layer 261 and the ohmic electrode 221 may be then heated.

Then, the intermediate electrode 212 is formed at a predetermined position of the spreading electrode 211 by vacuum deposition and photolithography (See FIG. 12B). The ohmic electrode 221 and the intermediate electrode 212 are made such that the top of the ohmic electrode 221 is at a higher level than that of the intermediate electrode 212. In this embodiment, the level difference at the top between the ohmic electrode 221 and the intermediate electrode 212 at this stage corresponds to that between the p-side bump 230 and the n-side bump 240. Then, the insulating portion 270 covering the n-side contact layer 261, the ohmic electrode 221, the mesa portion, the spreading electrode 211 and the intermediate electrode 212 is formed by vacuum deposition. Then, the reflection portion 280 is formed at a predetermined region on the insulating portion 270 except the intermediate electrode 212 and the ohmic electrode 221 by vacuum deposition and photolithography (See FIG. 12C).

Figure 13A:
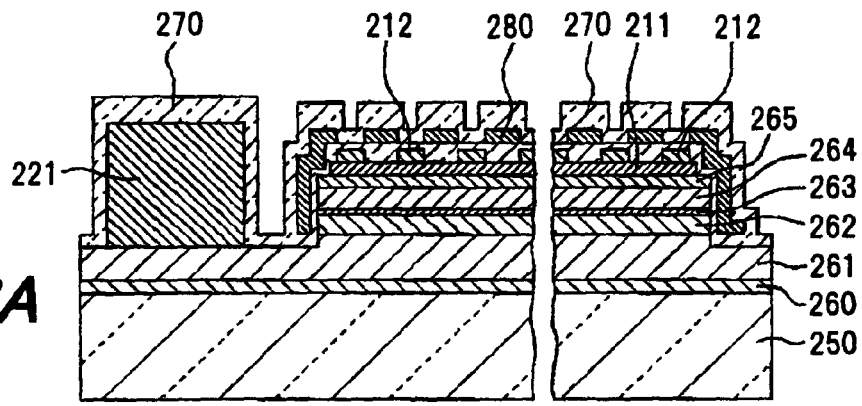
FIGS. 13A to 13C show a subsequent process in the production method of the light emitting element of the third embodiment, where
Figure 13B:
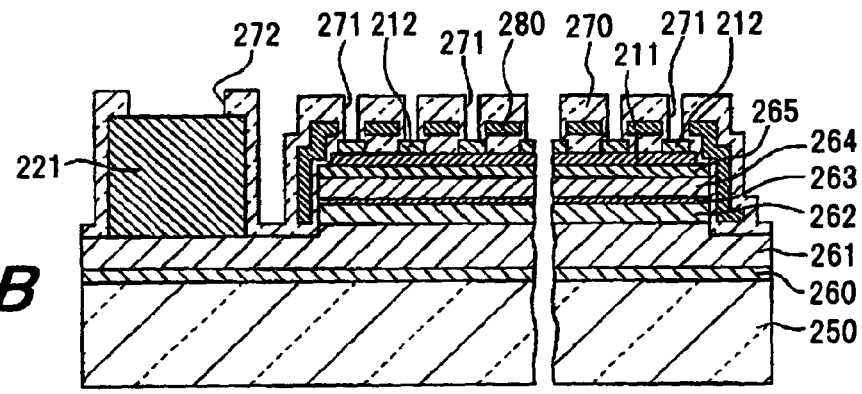
Figure 13C:
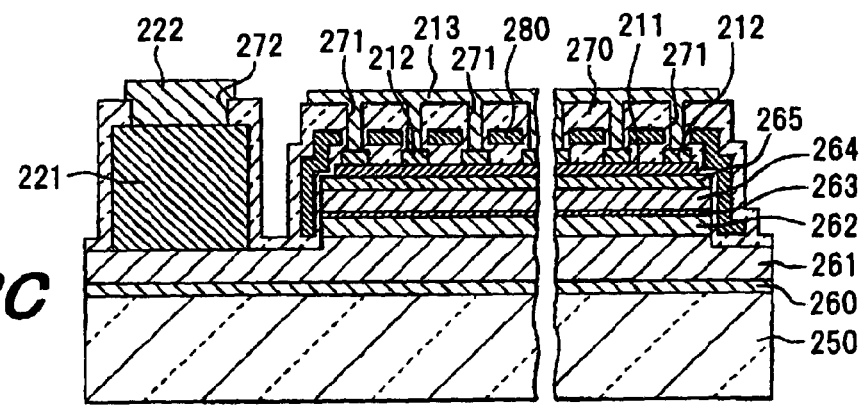

FIG. 13A is a cross sectional view showing the light emitting element in which an insulating portion is formed on the reflection portion. FIG. 13B is a cross sectional view showing the light emitting element in which openings are formed in the insulating portion. FIG. 13C is a cross sectional view showing the light emitting element in which ajoining electrode is formed.

Then, the insulating portion 270 is further formed wholly on the element (See FIG. 13A). Then, the insulating portion 270 on the ohmic electrode 221 and on the intermediate electrode 212 is removed by photolithography and etching.

Thereby, the opening 271 is formed on the intermediate electrode 212 and the opening 272 is formed on the ohmic electrode 221 (See FIG. 13B).

The p-side joining electrode 213 and the n-side joining electrode 222 are formed in the opening 271 and the opening 272, respectively, by vacuum deposition and photolithography (See FIG. 13C). In this embodiment, the p-side joining electrode 213 and the n-side joining electrode 222 are simultaneously produced at the same process so that they have the same height (vertical) dimension. The n-side contact layer 261, the intermediate electrode 212 and the joining electrodes 213, 222 may be also formed by sputtering. The insulating portion 270 may be also formed by CVD (chemical vapor deposition).

Then, Au—Sn solder is formed on the joining electrodes 213, 222 by plating to provide the p-side bump 230 and the n-side bump 240. Thereby, the light emitting element 201 can be produced such that the top of the n-side bump 240 is at a higher level than that of the p-side bump 230 (FIG. 9). In this embodiment, the p-side bump 230 and the n-side bump 240 are simultaneously produced at the same process so that they have the same height (vertical) dimension.

The light emitting element 201 thus produced is flip-chip bonded at a predetermined position of a submount of ceramics and with a conductive material wiring pattern formed thereon. Here, since the top of the n-side bump 240 is at a higher level than that of the p-side bump 230, the n-side bump 240 can be surely bonded to the wiring pattern on the submount. Further, since the p-side bump 230 has a volume greater than the n-side bump 240 although the p-side bump 230 is at a level lower than the n-side bump 240, the p-side bump 230 can be also surely bonded to the wiring pattern on the submount. Then, the light emitting element 201 mounted on the submount is sealed with a sealing material such as epoxy resin or glass to provide the packaged light emitting element 201.

Effects of the Third Embodiment

The light emitting element 201 thus produced is constructed such that the intermediate electrodes 212 are each disposed centrally in the width direction of the corresponding extended part 211a, and the unit distance 'a' is made to be nearly equal to a distance 'b' to the edge of the intermediate electrode 212. Therefore, when current is fed through the joining electrode 213 to the spreading electrode 211, current can be uniformly fed wholly to the spreading electrode 211 to increase the light output of the light emitting element 201. Further, due to the relatively narrow distance between the intermediate electrodes 212, the forward voltage can be reduced for a predetermined forward current.

Further, in this embodiment, the intermediate electrode 212 is formed circular (top view), the area of the intermediate electrode 212 is relatively small and the distance between the intermediate electrodes 212 is decreased. Thereby, the total length of the outline of the intermediate electrodes 212 increases such that current density flowing into the spreading electrode 211 can be lowered to prevent effectively deterioration of the electrode.

EXAMPLES

FIGS. 14 and 15 demonstrate examples of the invention and are graphs showing data obtained from samples produced. The samples have the same layer composition as the above embodiment, and are prepared such that the area of the intermediate electrode is changed and the interval of the intermediate electrode is changed. For example, four kinds of light emitting elements are produced. The first light emitting element is 578000 $\mu m^2$ in total area of the spreading electrode, 20 $\mu m$ in diameter of the intermediate electrode, 27 $\mu m$ in unit distance of the intermediate electrode, and 67 $\mu m$ in length from the intermediate electrode to the end of the spreading electrode in the width direction. The second light emitting element is 578000 $\mu m^2$ in total area of the spreading electrode, 40 $\mu m$ in diameter of the intermediate electrode, 37 $\mu m$ in unit distance of the intermediate electrode, and 67 $\mu m$ in length from the intermediate electrode to the end of the spreading electrode in the width direction. The third light emitting element is 578000 $\mu m^2$ in total area of the spreading electrode, 60 $\mu m$ in diameter of the intermediate electrode, 55 $\mu m$ in unit distance of the intermediate electrode, and 67 $\mu m$ in length from the intermediate electrode to the end of the spreading electrode in the width direction. The fourth light emitting element is 578000 $\mu m^2$ in total area of the spreading electrode, 80 $\mu m$ in diameter of the intermediate electrode, 110 $\mu m$ in unit distance of the intermediate electrode, and 67 $\mu m$ in length from the intermediate electrode to the end of the spreading electrode in the width direction.

FIG. 14 is a graph showing data obtained from examples of the invention, where the horizontal scale represents a total area of the intermediate electrode and the vertical scale represents a total radiant flux of light emitted from the light emitting element. In measuring the total radiant flux, an integrating sphere is used to detect the radiant flux in all directions. The radiant flux is measured feeding current of 350 mA to the first to fourth light emitting elements. As shown in FIG. 14, as the area of the intermediate electrode increases, the total radiant flux decreases. Thus, it is proved that the area of the intermediate electrode is to be decreased in order to increase the amount of light extracted from the light emitting element. The fourth light emitting element has nearly the same amount of light as the conventional one. The first to third light emitting elements have the amount of light more than the conventional one. Thus, it is confirmed that the amount of light increases by setting the diameter of the intermediate electrode to be not less than 20 $\mu m$ and less than 80 $\mu m$.

FIG. 15 is a graph showing data obtained from examples of the invention, where the horizontal scale represents a value of a total area of the spreading electrode divided by a total area of the intermediate electrode and the vertical scale represents a forward voltage needed to emit the light emitting element. As shown in FIG. 15, as the area of the spreading electrode per unit area of the intermediate electrode increases, the forward voltage increases. Thus, it is confirmed that the area of one intermediate electrode or the number of the intermediate electrodes is to be decreased so as not to increase the forward voltage.

Figure 16:
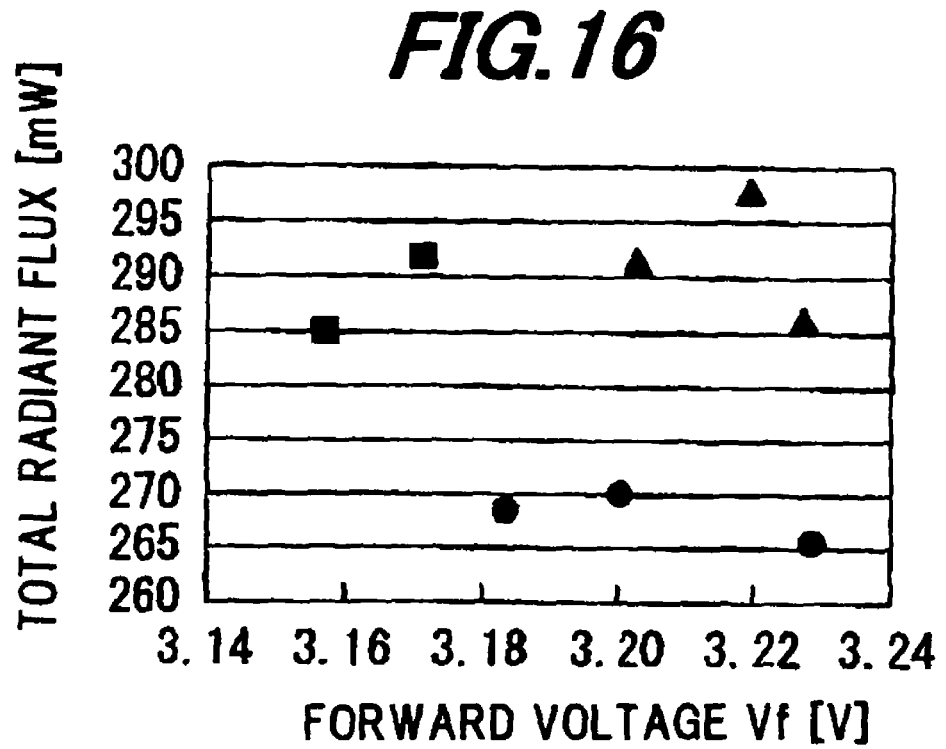
FIG. 16 is a graph showing data obtained from examples of the invention, where the horizontal scale represents a forward voltage and a total radiant flux of light emitted from the light emitting element.

FIG. 16 demonstrates examples of the invention and are graphs showing data obtained from samples produced. The samples have the same layer composition as the above embodiment, and are prepared such that the area of the intermediate electrode is changed and the interval of the intermediate electrode is changed. For example, three kinds of light emitting elements are produced. The fifth light emitting element is 578000 $\mu m^2$ in total area of the spreading electrode, 28 $\mu m$ in diameter of the intermediate electrode, 110 $\mu m$ in unit distance of the intermediate electrode, and 67 $\mu m$ in length from the intermediate electrode to the end of the spreading electrode in the width direction. The sixth light emitting element is 578000 $\mu m^2$ in total area of the spreading electrode, 28 $\mu m$ in diameter of the intermediate electrode, 55 $\mu m$ in unit distance of the intermediate electrode, and 67 $\mu m$ in length from the intermediate electrode to the end of the spreading electrode in the width direction. The seventh light emitting element is 578000 μm² in total area of the spreading electrode, 72 μm in diameter of the intermediate electrode, 110 μm in unit distance of the intermediate electrode, and 67 μm in length from the intermediate electrode to the end of the spreading electrode in the width direction.

FIG. 16 is a graph showing data obtained from examples of the invention, where the horizontal scale represents a forward voltage and the vertical scale represents a total radiant flux of light emitted from the light emitting element. As shown in FIG. 16, the seventh light emitting element has a relatively small amount of light, and the fifth and sixth light emitting elements have a relatively large amount of light. The fifth light emitting element has a relatively high forward voltage and the sixth light emitting element has a relatively low forward voltage. Accordingly, in order to have a relatively large amount of light and a relatively low forward voltage, the sixth light emitting element is most preferable among the fifth to seventh light emitting elements.

Modifications

In this embodiment, an example is exhibited in which the area of the p-side electrode is relatively large, and the p-side electrode and the n-side electrode are assigned to the first electrode and the second electrode, respectively. By contrast, when the area of the n-side electrode is relatively large, the n-side electrode and the p-side electrode may be assigned to the first electrode and the second electrode, respectively. In this case, the top of the p-side electrode is made to be at a higher level than that of the n-side electrode.

Although in this embodiment the light emitting element is formed with the group III nitride semiconductor layers, it may be formed with the other semiconductor layers.

Figure 17:
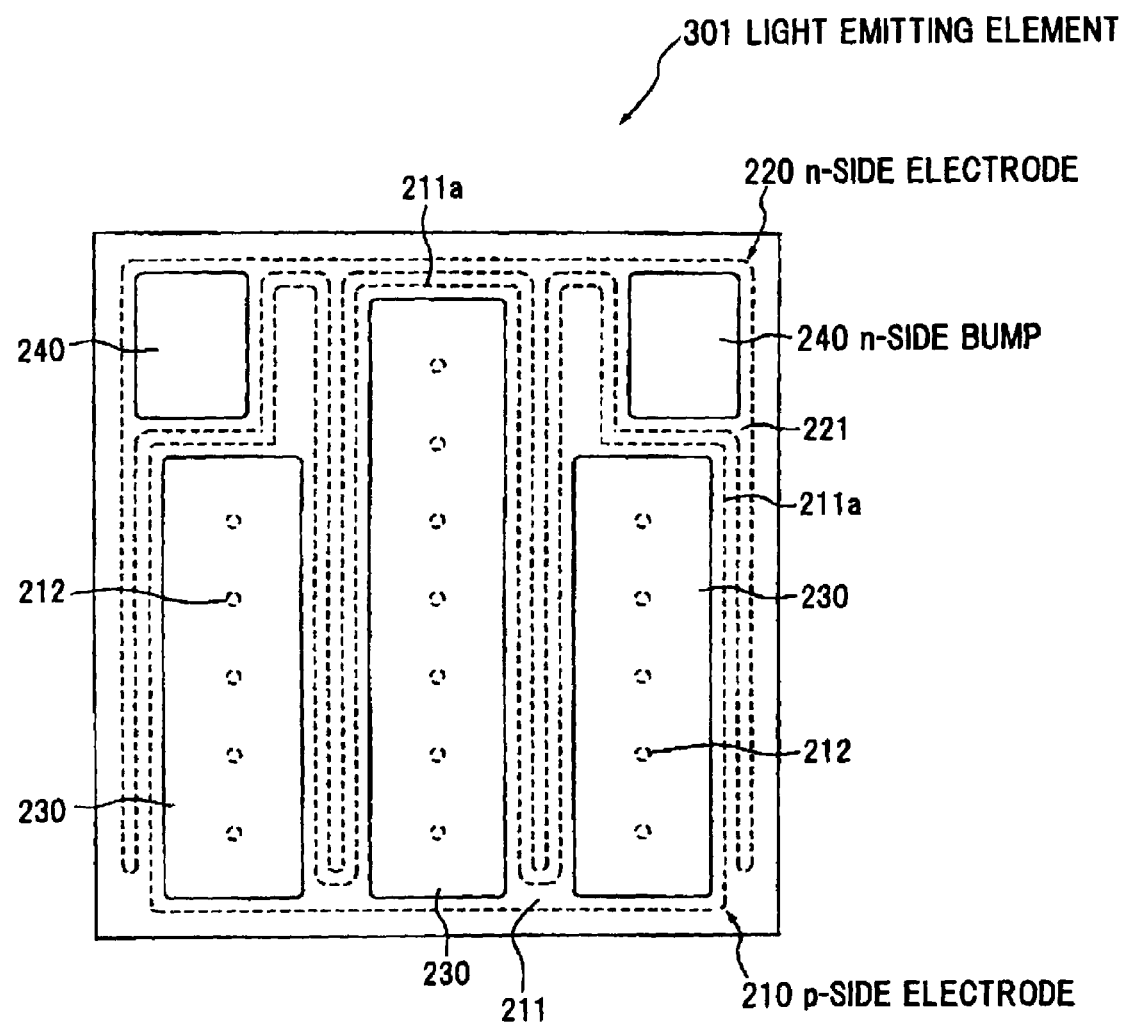
FIG. 17 is a top view showing a light emitting element in modification of the third embodiment.

Although in this embodiment the p-side electrode 210 is provided with the five extended parts 211a, the number of the extended parts 211a can be arbitrary, e.g., three extended parts 211a as shown in FIG. 17. Also, the n-side electrode 220 may be arbitrarily changed in shape, structure etc. For example, as shown in FIG. 17, a light emitting element 301 may be constructed such that the unit distance 'a' of the intermediate electrode 212 is 55 μm and length 'b' from the intermediate electrode 212 to the edge of the extended part 211a is 127 μm.

Although the invention has been described with respect to the specific embodiments and Examples for complete and clear disclosure, the appended claims are not to be thus limited. In particular, it should be noted that all of the combinations of features as described in the embodiment and Examples are not always needed to solve the problem of the invention.

What is claimed is:

1. A flip-chip type light emitting element, comprising:
a spreading electrode for feeding current to a light-emitting layer, the spreading electrode comprising an extended part extending in a predetermined direction;
a plurality of intermediate electrodes formed on the spreading electrode and arranged in a longitudinal direction of the extended part and centrally in a width direction of the extended part;
an insulating layer formed on the spreading electrode and on the plurality of intermediate electrodes; and
a joining electrode formed on the insulating layer for feeding current through the plurality of intermediate electrodes to the spreading electrode,
wherein the plurality of intermediate electrodes are disposed such that a distance of half a pitch thereof in the longitudinal direction is equal to or shorter than a distance measured in the width direction from one of the plurality of intermediate electrodes to an edge of the extended part.

2. The flip-chip type light emitting element according to claim 1, wherein the spreading electrode is shaped like teeth of a comb in a top view, wherein a plurality of the extended parts are arranged in the width direction.

3. The flip-chip type light emitting element according to claim 2, wherein the plurality of intermediate electrodes are each shaped like a circle in a top view with a diameter of not less than 20 μm and less than 80 μm.

4. The flip-chip type light emitting element according to claim 1, wherein the insulating layer abuts the plurality of intermediate electrodes.

5. The flip-chip type light emitting element according to claim 1, wherein the joining electrode is disposed on an upper surface of the plurality of intermediate electrodes.

6. The flip-chip type light emitting element according to claim 1, wherein the joining electrode abuts an upper surface of each of the plurality of intermediate electrodes.

7. The flip-chip type light emitting element according to claim 1, wherein a lower surface of the joining electrode abuts an upper surface of one of the plurality of intermediate electrodes.

8. The flip-chip type light emitting element according to claim 1, wherein the joining electrode is a different layer from a layer of the plurality of intermediate electrodes.

9. The flip-chip type light emitting element according to claim 1, further comprising a reflection portion disposed in the insulating layer.

10. The flip-chip type light emitting element according to claim 9, wherein the insulating layer is disposed between the spreading electrode and the reflection portion.

11. The flip-chip type light emitting element according to claim 1, wherein the pitch is defined as a distance between centers of adjacent intermediate electrodes, and said distance to the edge of the extended part is defined as a distance from a center of said one of the plurality of intermediate electrode to the edge of the extended part.

12. The flip-chip type light emitting element according to claim 1, further comprising:
another joining electrode formed on corners of the joining electrode on the light emitting element.

13. The flip-chip type light emitting element according to claim 12, further comprising:
a bump disposed on the joining electrode; and
another bump disposed on said another joining electrode, wherein an upper surface of said another bump is located higher than the bump.

14. The flip-chip type light emitting element according to claim 12, wherein said another joining electrode comprises a first electrode located on a side of the joining electrode and a second electrode located on another side of the joining electrode.

15. The flip-chip type light emitting element according to claim 14, wherein, in a plan view, said first and second electrodes of said another joining electrode are located above a first section of the plurality of intermediate electrodes and sandwich a second section of the plurality of intermediate electrodes.

16. The flip-chip type light emitting element according to claim 1, wherein the spreading electrode further comprises a transparent electrode.

\* \* \* \* \*